United States Patent
Nakamura et al.

(10) Patent No.: US 11,773,009 B2
(45) Date of Patent: *Oct. 3, 2023

(54) GLASS COMPOSITION, GLASS FIBER, GLASS CLOTH, AND METHOD FOR PRODUCING GLASS FIBER

(71) Applicants: Nippon Sheet Glass Company, Limited, Tokyo (JP); UNITIKA LTD., Osaka (JP); UNITIKA GLASS FIBER CO., LTD., Uji (JP)

(72) Inventors: Aya Nakamura, Mie (JP); Hidetoshi Fukuchi, Mie (JP); Junji Kurachi, Hyogo (JP); Riku Sawai, Kyoto (JP); Takaharu Miyazaki, Nara (JP); Yoshito Nawa, Kyoto (JP); Kohji Hattori, Gifu (JP)

(73) Assignees: NIPPON SHEET GLASS COMPANY, LIMITED, Tokyo (JP); UNITIKA LTD., Osaka (JP); UNITIKA GLASS FIBER CO., LTD., Kyoto (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/880,202

(22) Filed: Aug. 3, 2022

(65) Prior Publication Data

US 2022/0402811 A1 Dec. 22, 2022

Related U.S. Application Data

(63) Continuation of application No. 17/596,887, filed as application No. PCT/JP2020/024255 on Jun. 19, 2020, now abandoned.

(30) Foreign Application Priority Data

Jun. 21, 2019 (WO) .................. PCT/JP2019/024791

(51) Int. Cl.

| | | |
|---|---|---|
| *C03C 13/00* | (2006.01) | |
| *C03B 37/02* | (2006.01) | |
| *C03C 4/16* | (2006.01) | |
| *H05K 1/03* | (2006.01) | |
| *C03C 3/091* | (2006.01) | |
| *C08J 5/24* | (2006.01) | |

(52) U.S. Cl.
CPC .............. *C03C 13/00* (2013.01); *C03B 37/02* (2013.01); *C03C 3/091* (2013.01); *C03C 4/16* (2013.01); *C08J 5/244* (2021.05); *H05K 1/0306* (2013.01); *H05K 1/038* (2013.01); *C03C 2204/00* (2013.01); *C03C 2213/00* (2013.01); *H05K 2201/029* (2013.01)

(58) Field of Classification Search
None
See application file for complete search history.

(56) References Cited

U.S. PATENT DOCUMENTS

| | | | |
|---|---|---|---|
| 4,824,806 A | 4/1989 | Yokoi et al. | |
| 5,958,808 A * | 9/1999 | Mori ....................... | C03C 13/00 501/36 |
| 6,231,986 B1 | 5/2001 | Sugimoto et al. | |
| 7,598,191 B2 | 10/2009 | Fechner et al. | |
| 8,697,590 B2 * | 4/2014 | Li ......................... | H05K 1/0366 501/36 |
| 11,174,191 B2 * | 11/2021 | Inaka ..................... | C03C 3/091 |

(Continued)

FOREIGN PATENT DOCUMENTS

| | | | |
|---|---|---|---|
| CN | 101080804 B | | 3/2012 |
| CN | 101012105 B | * | 5/2019 |
| JP | S58-151345 | | 9/1983 |
| JP | S62-100454 | | 5/1987 |
| JP | S6451345 A | | 2/1989 |
| JP | H08-333137 | | 12/1996 |
| JP | S62-226839 | | 10/1997 |
| JP | 10-036167 | | 2/1998 |
| JP | H10-095633 | | 4/1998 |
| JP | 3240271 | * | 10/2001 |
| JP | 2003-137590 | | 5/2003 |
| JP | 2004-505002 | | 2/2004 |
| JP | 2009-286686 | | 12/2009 |
| JP | 2010-006690 | | 1/2010 |
| JP | 2010-508226 | | 3/2010 |
| JP | 5578322 | * | 7/2014 |
| JP | 2018-127750 | | 8/2018 |

(Continued)

OTHER PUBLICATIONS

International Search Report issued for International Patent Application No. PCT/JP2020/024255, dated Sep. 8, 2020, 9 pages including English translation.
Written Opinion issued for International Patent Application No. PCT/JP2020/024255, dated Sep. 8, 2020, 12 pages.
Samuneva, B. et al., "Interaction Between Glasses and Alkali Metal Vapours," Journal of Non-Crystalline Solids 112 (1989) pp. 385-391.

(Continued)

*Primary Examiner* — Tae H Yoon
(74) *Attorney, Agent, or Firm* — Hamre, Schumann, Mueller & Larson, P.C.

(57) ABSTRACT

The present disclosure provides a novel glass composition that has a low permittivity and is suitable for mass production. A glass composition provided satisfies, in wt %, for example, $40 \leq SiO_2 \leq 60$, $25 \leq B_2O_3 \leq 45$, $0 < Al_2O_3 \leq 18$, $0 < R_2O \leq 5$, and $0 \leq RO \leq 12$, and satisfies at least one of: i) $SiO_2 + B_2O_3 \geq 80$ and $SiO_2 + B_2O_3 + Al_2O_3 \leq 99.9$; and ii) $SiO_2 + B_2O_3 \geq 78$, $SiO_2 + B_2O_3 + Al_2O_3 \leq 99.9$, and $0 < RO < 10$. Another glass composition provided includes $SiO_2$, $B_2O_3$, $Al_2O_3$, $R_2O$, and $3 < RO < 8$ at the same contents as the above, and satisfies $SiO_2 + B_2O_3 \geq 75$ and $SiO_2 + B_2O_3 + Al_2O_3 < 97$, where $R_2O = Li_2O + Na_2O + K_2O$ and $RO = MgO + CaO + SrO$.

22 Claims, No Drawings

(56) References Cited

U.S. PATENT DOCUMENTS

| | | |
|---|---|---|
| 2012/0095149 A1 | 4/2012 | Sawanoi et al. |
| 2018/0305846 A1* | 10/2018 | Tachibana ............ D03D 15/267 |
| 2019/0144329 A1 | 5/2019 | Inaka et al. |
| 2019/0210911 A1 | 7/2019 | Ono et al. |
| 2020/0087196 A1 | 3/2020 | Inaka et al. |

FOREIGN PATENT DOCUMENTS

| | | |
|---|---|---|
| WO | 02/10083 | 2/2002 |
| WO | 2008/052154 | 5/2008 |
| WO | 2017/187471 | 11/2017 |
| WO | 2018/051793 | 3/2018 |
| WO | 2018/216637 | 11/2018 |

OTHER PUBLICATIONS

Extended European Search Report issued for European Patent Application No. 20825463.1, dated Aug. 11, 2023, 7 pages.

* cited by examiner

GLASS COMPOSITION, GLASS FIBER, GLASS CLOTH, AND METHOD FOR PRODUCING GLASS FIBER

The present application is a continuation application of U.S. application Ser. No. 17/596,887, filed Dec. 20, 2021, which is the national stage entry of international application PCT/JP2020/024255, filed Jun. 19, 2020, which claims the benefit of PCT application PCT/JP2019/024791, filed Jun. 21, 2019, all of which are incorporated by reference.

TECHNICAL FIELD

The present invention relates to a glass composition, and a glass fiber and a glass cloth that are formed of the composition. The present invention further relates to a method for producing glass fiber.

BACKGROUND ART

One type of printed circuit board mounted in electronic devices is a board formed of a resin, a glass fiber, an inorganic filler, and an additional material such as a curing agent or a modifying agent as necessary. Also, some of printed wiring boards, which have no electronic components installed, are constituted in the same manner as the above board. Hereinafter, in the present description, both the printed circuit board and the printed wiring board are referred to as a "printed board". In such a printed board, the glass fiber functions as an insulator, as a heat-resistant material, and as a reinforcement of the board. The glass fiber is included in a printed board in the form of, for example, a glass cloth, which is produced by weaving a glass yarn constituted of a plurality of glass fibers bundled together. Also, a glass cloth is usually used, in printed boards, as a prepreg impregnated with a resin. In recent years, printed boards have been made thinner to meet the demand for reducing the size of electronic devices and the demand for increasing the degree of integration of printed boards to achieve a high performance. To achieve a thinner printed board, a glass fiber having a smaller fiber diameter is needed. Furthermore, because for example of a rapidly increasing demand for high-speed transmission of large volumes of data, a glass fiber for printed boards is required to have a low permittivity.

Glass is sometimes used also as an inorganic filler for use in printed boards. Typical examples of the inorganic filler include a glass flake. When a shaped glass material such as a glass flake is used as an inorganic filler in a printed board, the shaped material is required to have the same properties as those of the glass fiber for printed boards, for example, a low permittivity.

Glass fibers formed of low-permittivity glass compositions are disclosed in Patent Literatures 1 to 5.

CITATION LIST

Patent Literature

Patent Literature 1: JP S62-226839 A
Patent Literature 2: JP 2010-508226 A
Patent Literature 3: JP 2009-286686 A
Patent Literature 4: WO 2017/187471 A1
Patent Literature 5: WO 2018/216637 A1

SUMMARY OF INVENTION

Technical Problem

A glass composition is required to have characteristic temperatures suitable for mass production as well as to have a low permittivity. One characteristic temperature of the glass composition important for mass production of a glass fiber is a temperature T3 serving as the reference for the forming temperature, that is, a temperature at which the viscosity is 103 dPa·s. Temperatures T2 and T2.5 and a devitrification temperature TL also serve as indicators for determining whether the glass composition is suitable for mass production of a glass fiber. However, it is not easy to adjust the characteristic temperatures of a glass composition having a low permittivity.

In view of the above, the present invention aims to provide a novel glass composition that has a low permittivity and is suitable for mass production.

Solution to Problem

The present invention provides a glass composition including, in wt %:
$40 \leq SiO_2 \leq 60$;
$25 \leq B_2O_3 \leq 45$;
$5 \leq Al_2O_3 \leq 15$;
$0 < R_2O \leq 5$; and
$0 < RO < 15$, wherein
the glass composition satisfies:
$SiO_2+B_2O_3 \geq 80$; and/or
$SiO_2+B_2O_3 \geq 78$ and $0 < RO < 10$.

In the present specification, $R_2O$ is at least one oxide selected from $Li_2O$, $Na_2O$, and $K_2O$, and RO is at least one oxide selected from MgO, CaO, and SrO.

In another aspect, the present invention provides a glass composition including, in wt %:
$40 \leq SiO_2 \leq 60$;
$25 \leq B_2O_3 \leq 45$;
$0 < Al_2O_3 \leq 18$;
$0 < R_2O \leq 5$; and
$0 \leq RO \leq 12$, wherein
the glass composition satisfies at least one of:
i) $SiO_2+B_2O_3 \geq 80$ and $SiO_2+B_2O_3+Al_2O_3 \leq 99.9$; and
ii) $SiO_2+B_2O_3 \geq 78$, $SiO_2+B_2O_3+Al_2O_3 \leq 99.9$, and $0 < RO < 10$.

In another aspect, the present invention provides a glass composition, including, in wt %:
$40 \leq SiO_2 \leq 60$;
$25 \leq B_2O_3 \leq 45$;
$0 < Al_2O_3 \leq 18$;
$0 < R_2O \leq 5$; and
$3 < RO < 8$, wherein
the glass composition satisfies:
$SiO_2+B_2O_3 \geq 75$; and
$SiO_2+B_2O_3+Al_2O_3 < 97$.

In another aspect, the present invention provides a glass composition, satisfying, in wt %, $SiO2+B2O3 \geq 77$, wherein
a permittivity at a frequency of 1 GHz is 4.4 or less,
a dielectric loss tangent at a frequency of 1 GHz is 0.007 or less, and
a temperature T2 at which a viscosity is 102 dPa·s is 1700° C. or less.

In another aspect, the present invention provides a glass composition including, in wt %:
$40 \leq SiO_2 \leq 49.95$;
$25 \leq B_2O_3 \leq 40$;
$10 \leq Al_2O_3 \leq 20$;
$0.1 \leq R_2O \leq 2$; and
$1 \leq RO \leq 10$, wherein
the glass composition satisfies:
$SiO_2+B_2O_3 \geq 70$; and
$SiO_2+B_2O_3+Al_2O_3 \leq 97$.

In another aspect, the present invention provides a glass composition including, in wt %:

40≤SiO$_2$≤49.95;
25≤B$_2$O$_3$≤29.9;
10≤Al$_2$O$_3$≤20;
0.1≤R$_2$O≤1; and
2≤RO≤8, wherein
the glass composition satisfies:
SiO$_2$+B$_2$O$_3$≥70; and
SiO$_2$+B$_2$O$_3$+Al$_2$O$_3$≤97.

In another aspect, the present invention provides a glass composition including, in wt %:

40≤SiO$_2$≤49.95;
31≤B$_2$O$_3$≤40;
8≤Al$_2$O$_3$≤18;
0.1≤R$_2$O≤1; and
1≤RO≤10, wherein
the glass composition satisfies:
SiO$_2$+B$_2$O$_3$≥77; and
SiO$_2$+B$_2$O$_3$+Al$_2$O$_3$≤97.

In yet another aspect, the present invention provides a glass fiber including the glass composition according to the present invention.

In yet another aspect, the present invention provides a glass cloth including the glass fiber according to the present invention.

In yet another aspect, the present invention provides a prepreg including the glass cloth according to the present invention.

In yet another aspect, the present invention provides a printed board including the glass cloth according to the present invention.

In yet another aspect, the present invention provides a method for producing glass fiber, the method including melting the glass composition according to the present invention at a temperature of 1400° C. or more to obtain a glass fiber having an average fiber diameter of 1 to 6 μm.

Advantageous Effects of Invention

According to the present invention, it is possible to provide a glass composition that has a lower permittivity and has characteristic temperatures suitable for mass production.

DESCRIPTION OF EMBODIMENTS

Hereinafter, the symbol "%" indicating the content of each component means "wt %" in every case. The phrase "substantially free of" means that the content is less than 0.1 wt %, preferably less than 0.07 wt %, and more preferably less than 0.05 wt %. The term "substantially" in this phrase is intended to allow impurities inevitably introduced from industrial raw materials within the above limits. The content, properties, and other preferred ranges of each component can be understood by arbitrarily combining the upper and lower limits individually described below.

In the following description, as the characteristic temperature of a glass composition, a temperature at which the viscosity is 10$^n$ dPa·s is expressed as Tn (for example, T2.5 means a temperature at which the viscosity of the glass composition is 10$^{2.5}$ dPa·s). Permittivity refers to relative permittivity (dielectric constant) in a strict sense. In the present specification, relative permittivity is expressed simply as permittivity, as is conventional. Values of permittivity and dielectric loss tangent are those determined at room temperature (25° C.). The following description is not intended to limit the present invention, and is provided in the sense of indicating preferred embodiments thereof.

[Components of Composition]

(SiO$_2$)

SiO$_2$ is a component forming a network structure of glass. SiO$_2$ acts to decrease the permittivity of a glass composition. An excessively low SiO$_2$ content cannot sufficiently decrease the permittivity of the glass composition. An excessively high SiO$_2$ content excessively increases the viscosity at melting and thus a homogeneous glass composition is difficult to obtain. A decrease in homogeneity of the glass composition induces fiber breakage of a glass fiber, particularly a glass fiber having a small fiber diameter, during fiber forming. The SiO$_2$ content is preferably 40% or more, 45% or more, 46% or more, more preferably 48% or more, and particularly preferably 49% or more, and may be, in some cases, 50% or more, even 50.5% or more, 51% or more, 52% or more, or 53% or more. The SiO$_2$ content is preferably 60% or less, less than 58%, 56% or less, more preferably less than 55%, and particularly preferably 54.5% or less, and may be, in some cases, 54% or less, 53% or less, 52% or less, or 51% or less. An example of a preferred range of the SiO$_2$ content is 40% or more and less than 58%, and even 40% or more and less than 55%. In addition, the SiO$_2$ content can be 40% or more and 49.95% or less.

(B$_2$O$_3$)

B$_2$O$_3$ is a component forming a network structure of glass. B$_2$O$_3$ acts to decrease the permittivity of the glass composition, and also acts to decrease the viscosity of the glass composition at melting to improve the defoaming performance (bubble removability), thereby reducing inclusion of bubbles in the glass fiber formed. On the other hand, B$_2$O$_3$ is prone to volatilization at melting of the glass composition. An excessively high content of B$_2$O$_3$ makes it difficult to achieve a sufficient homogeneity of the glass composition, insufficiently reduces inclusion of bubbles in the glass fiber, or causes a so-called fiber breakage due to deposition of B$_2$O$_3$ volatilized from glass on tips of a bushing used for fiber forming. The B$_2$O$_3$ content is preferably 25% or more, 27% or more, 29% or more, 30% or more, and more preferably more than 30%, and may be, in some cases, 30.5% or more, even 31% or more, 32% or more, 33% or more, or 34% or more. The B$_2$O$_3$ content is preferably 45% or less, 43% or less, 41% or less, and more preferably 39% or less, and may be, in some cases, 38% or less, even 36% or less, 35% or less, 34% or less, or 32% or less. An example of a preferred range of the B$_2$O$_3$ content is more than 30% and 45% or less. In addition, the B$_2$O$_3$ content can be 25% or more and 40% or less, 25% or more and 29.9% or less, or 31% or more and 40% or less.

(SiO$_2$+B$_2$O$_3$), (SiO$_2$+B$_2$O$_3$+Al$_2$O$_3$)

To obtain a glass composition having a sufficiently low permittivity, the total of the SiO$_2$ content and the B$_2$O$_3$ content, that is, (SiO$_2$+B$_2$O$_3$) may be adjusted to 77% or more, 78% or more, or even 80% or more. (SiO$_2$+B$_2$O$_3$) is preferably 81% or more, 82% or more, and more preferably 83% or more, and may be, in some cases, 84% or more, or even 85% or more. (SiO$_2$+B$_2$O$_3$) may be 90% or less, or even 87.5% or less. This is because an excessively high value of (SiO$_2$+B$_2$O$_3$) encourages the tendency for the glass composition to undergo phase separation. In addition, (SiO$_2$+B$_2$O$_3$) can be 70% or more. The total of the SiO$_2$ content, the B$_2$O$_3$ content, and the Al$_2$O$_3$ content, that is, (SiO$_2$+B$_2$O$_3$+Al$_2$O$_3$) is suitably 99.9% or less in order to allow additional components. (SiO$_2$+B$_2$O$_3$+Al$_2$O$_3$) may be 98% or less, 97% or less, less than 97%, or even 96% or less. In a preferred example of a combination of (SiO$_2$+B$_2$O$_3$) and ($SiO_2+B_2O_3+Al_2O_3$), ($SiO_2+B_2O_3$) is 82% or more and ($SiO_2+B_2O_3+Al_2O_3$) is 98% or less. Also, ($SiO_2+B_2O_3+Al_2O_3$) can be 90% or more and 98% or less, or 90% or more and 97% or less.

The ratio of ($SiO_2+B_2O_3+Al_2O_3$) to ($SiO_2+B_2O_3$), that is, ($SiO_2+B_2O_3+Al_2O_3$)/($SiO_2+B_2O_3$) is preferably 1.05 or more, and may be 1.12 or more, 1.13 or more, 1.15 or more, or 1.20 or more. As this ratio increases, a defect such as fluffing of the glass fiber is reduced more. This effect becomes remarkable in a fifth combination of the $SiO_2$ and $B_2O_3$ contents described later.

(Preferred Combination of $SiO_2$ and $B_2O_3$)

To obtain a glass composition that has a lower permittivity and is easy to melt, there are combinations of the $SiO_2$ and $B_2O_3$ contents within preferred ranges. A first combination is a combination in which the $SiO_2$ content is 48 to 51%, preferably 49 to 51%, and more preferably 50 to 51%, and the $B_2O_3$ content is 33 to 35%, and preferably 34 to 35%. A second combination is a combination in which the $SiO_2$ content is 50 to 53%, and preferably 51 to 52%, and the $B_2O_3$ content is 32 to 35%, and preferably 32 to 34%. A third combination is a combination in which the $SiO_2$ content is 52 to 54%, and preferably 52.5 to 54%, and the $B_2O_3$ content is 31 to 34%, and preferably 32 to 34%. A fourth combination is a combination in which the $SiO_2$ content is 52 to 55%, and preferably 53 to 55%, and the $B_2O_3$ content is 30 to 32%.

A fifth combination is a combination in which the $SiO_2$ content is 47 to 52%, preferably 48 to 51%, more preferably 48.5 to 50.5%, and particularly preferably 48.95 to 49.95%, and the $B_2O_3$ content is 25 to 30%, preferably 26 to 29.5%, and more preferably 26 to 29%. In the fifth combination, the total of the MgO content and the CaO content, that is, (MgO+CaO) is suitably 3.5% or more, and more suitably 4% or more, and is suitably 8% or less. A sixth combination is a combination in which the $SiO_2$ content is 48 to 53%, preferably 49 to 52%, and more preferably 49 to 51.5%, and is, in some cases, 49 to 51% or 48.95 to 49.95%, and the $B_2O_3$ content is 28 to 35%, and preferably 30 to 33%, and is, in some cases, 30.5 to 32.5%. In the sixth combination, (MgO+CaO) is 1% or more and less than 3.5%, preferably 1 to 3%, and more preferably 1 to 2.5%, and is 1.5 to 2.5% in some cases.

($Al_2O_3$)

$Al_2O_3$ is a component forming a network structure of glass. $Al_2O_3$ acts to enhance the chemical durability of the glass composition. On the other hand, $Al_2O_3$ makes the glass composition more likely to suffer devitrification during fiber formation. The $Al_2O_3$ content is preferably 5% or more, 7.5% or more, 8% or more, 9% or more, and more preferably 10% or more, and may be, in some cases, 10.5% or more, 12% or more, or 13% or more. The $Al_2O_3$ content is preferably 20% or less, 18% or less, 17% or less, and more preferably 15% or less, and may be, in some cases, 14% or less, even 13% or less, or 12.5% or less. An example of the $Al_2O_3$ content suitable for reliably controlling the devitrification temperature TL to fall within a range lower than the temperature T3 is 12.3% or less. $Al_2O_3$ is generally understood to be a component that increases the viscosity of a glass composition at melting. However, in a glass composition having a high value of $SiO_2+B_2O_3$, $Al_2O_3$ can act to distinctively decrease the viscosity at melting.

An example of a preferred range of the $Al_2O_3$ content is 8 to 12.5%, and particularly 10 to 12.5%. In the case where the above first to fourth combinations of the $SiO_2$ and $B_2O_3$ contents are employed, these ranges are particularly suitable.

Another example of the preferred range of the $Al_2O_3$ content is 13 to 17%. In the case where the above fifth combination of the $SiO_2$ and $B_2O_3$ contents is employed, the $Al_2O_3$ content is particularly suitably 13 to 17%. Still another example of the preferred range of the $Al_2O_3$ content is 12 to 15%. In the case where the sixth combination of the $SiO_2$ and $B_2O_3$ contents is employed, the $Al_2O_3$ content is particularly suitably 12 to 15%.

Alkali metal oxides are known as components acting to decrease the viscosity at melting, but an increase in content of such an alkali metal oxide increases the permittivity simultaneously. In contrast, in the preferred glass composition according to the present invention, $Al_2O_3$ acts to distinctively decrease the viscosity at melting, but its adverse effect of increasing the permittivity is slight.

(MgO)

MgO is an optional component that decreases the viscosity of the glass composition at melting to reduce inclusion of bubbles in the glass fiber, thereby improving the homogeneity of the glass composition. The MgO content may be 0.1% or more, 0.2% or more, even 0.5% or more, or 0.6% or more, and may be, in some cases, 0.8% or more, or even 1% or more. The MgO content is preferably less than 10%, 8% or less, 7% or less, or 5% or less, and may be, in some cases, 3% or less, even 2% or less, or particularly 1.6% or less. To set the ratio to the CaO content within an appropriate range, the MgO content is sometimes preferably 1.7% or less, 1.5% or less, more preferably 1.2% or less, and 1% or less. However, depending on the content of additional components, the optimum MgO content is sometimes 2% or more, for example 2 to 8%, even 2 to 5%, or 3 to 5%. MgO has a great effect of decreasing the devitrification temperature, but does not increase the permittivity as much as an alkali metal oxide $R_2O$. Accordingly, it is preferable to add MgO in preference to $R_2O$, in other words, such that the MgO content is higher than the $R_2O$ content.

An example of a preferred range of the MgO content is 0.5 to 2%. In the case where the first to fourth combinations of the $SiO_2$ and $B_2O_3$ contents are employed, the MgO content is particularly suitably 0.5 to 2% and even 0.5 to 1.6%. In the case where the fifth combination of the $SiO_2$ and $B_2O_3$ contents is employed, the MgO content is particularly suitably 0.5 to 2% and even 1 to 2%. Another example of the preferred range of the MgO content is 0.1 to 1%. In the case where the sixth combination of the $SiO_2$ and $B_2O_3$ contents is employed, the MgO content is particularly suitably 0.1 to 1% and even 0.1% or more and less than 1%.

(CaO)

CaO is an optional component that improves the meltability of a glass raw material to decrease the viscosity of the glass composition at melting. The action of CaO is more significant than that of MgO. The CaO content may be 0.1% or more, 0.5% or more, or even 1% or more, and may be, in some cases, 1.5% or more, or even 2% or more. The CaO content is preferably less than 10%, 7% or less, and 5% or less, and may be, in some cases, 4% or less, 3.5% or less, 3% or less, or even 2.5% or less. CaO has a great effect of increasing the permittivity of the glass composition compared with MgO and ZnO. For the same reason as MgO, it is preferable to add CaO likewise in preference to an alkali metal oxide $R_2O$, in other words, such that the CaO content is higher than that the $R_2O$ content.

An example of a preferred range of the CaO content is 2 to 5%, and even 2 to 3.5%. In the case where the first to fifth combinations of the $SiO_2$ and $B_2O_3$ contents are employed, the CaO content is particularly suitably 2 to 5%. For the first to fourth combinations, 2 to 3.5% is more suitable. For the fifth combination, 2.5 to 5% is more suitable. Another example of the preferred range of the CaO content is 0.5 to 2%. In the case where the sixth combination of the $SiO_2$ and $B_2O_3$ contents is employed, the CaO content is particularly suitably 0.5 to 2%.

An example of a particularly preferred combination of the MgO content and the CaO content is a combination in which the MgO content is 1 to 2% and the CaO content is 2 to 5%. This combination is particularly suitable in the case where the fifth combination of the $SiO_2$ and $B_2O_3$ contents is employed.

(SrO)

SrO is also an optional component that improves the meltability of a glass raw material to decrease the viscosity of the glass composition at melting. However, SrO increases the permittivity of the glass composition compared with MgO and CaO, and accordingly it is desirable to limit the SrO content. The SrO content is preferably 1% or less, 0.5% or less, and more preferably 0.1% or less. The glass composition may be substantially free of SrO.

In the case where the first to fifth combinations of the $SiO_2$ and $B_2O_3$ contents are employed, the SrO content is particularly suitably 0.1% or less. In this case, the glass composition may be substantially free of SrO. However, there is a case where SrO may be added such that the SrO content is 0.1 to 5%, and even 1 to 3.5%. In the case where the sixth combination of the $SiO_2$ and $B_2O_3$ contents is employed, the SrO content is particularly suitably 0.1 to 5% and even 1 to 3.5%. In particularly the sixth combination, it has been found that SrO can effectively act to decrease the dielectric loss, in other words, to decrease the dielectric loss tangent, contrary to technical common sense of a person skilled in the art. In the sixth combination, SrO/CaO representing the ratio of the SrO content to the CaO content may exceed 1. In this case, CaO/MgO representing the ratio of the CaO content to the MgO content also may exceed 1.

(RO)

The RO content, that is, the total of the contents of MgO, CaO and SrO is preferably less than 15%, 12% or less, 10% or less, less than 10%, 9.5% or less, 8% or less, more preferably less than 7%, and particularly preferably 6% or less, and may be, in some cases, 5% or less, or even 4% or less. An excessively high RO content may insufficiently decrease the permittivity. Although the components constituting RO are each individually an optional component, it is preferable that at least one of the components should be contained, that is, the total of the contents of the components should exceed 0%. The RO content is preferably 1% or more, 1.5% or more, 2% or more, and more preferably 2.5% or more, and may be, in some cases, 3% or more, or even 3.5% or more.

A preferred example of a range of the RO content is 2 to 7%, and particularly 2 to 4%.

(MgO/RO)

MgO/RO, that is, the ratio of the MgO content to the RO content is preferably less than 0.8, and more preferably less than 0.7, and may be, in some cases, 0.5 or less, or 0.4 or less. When MgO/RO increases, the tendency for the glass composition to undergo phase separation becomes remarkable, and thus the homogeneity of the glass composition may be impaired. In addition, fiber forming may become difficult due to a mixture of phases differing in physical properties from each other. On the other hand, to decrease the permittivity of the glass composition, MgO/RO is preferably 0.1 or more, and more preferably 0.14 or more, and may be 0.19 or more in some cases. MgO/RO is preferably 0.1 to 0.5.

(MgO/(MgO+CaO))

MgO/(MgO+CaO), that is, the ratio of the MgO content to the total of the MgO and CaO contents may also fall within a range of any combination of the upper and lower limits described above for MgO/RO. MgO/(MgO+CaO) is preferably 0.1 to 0.5, and particularly preferably 0.1 to 0.4.

($Li_2O$)

$Li_2O$ is an optional component that, even when added in a small amount, acts to decrease the viscosity of the glass composition at melting to reduce inclusion of bubbles in the glass fiber, and further acts to reduce devitrification. Also, addition of $Li_2O$ in an appropriate amount remarkably reduces the tendency for the glass composition to undergo phase separation. However, $Li_2O$ increases the permittivity of the glass composition although its action is relatively weaker than that of other $R_2O$. The $Li_2O$ content is preferably 1.5% or less, 1% or less, and 0.5% or less, and may be, in some cases, 0.4% or less, 0.3% or less, or even 0.2% or less. The $Li_2O$ content is preferably 0.01% or more, 0.03% or more, and more preferably 0.05% or more. An example of a preferred range of the $Li_2O$ content is 0.01 to 0.5%, and even 0.05 to 0.4%.

($Na_2O$)

$Na_2O$ is also an optional component that, even when added in a small amount, acts to decrease the viscosity of the glass composition at melting to reduce inclusion of bubbles in the glass fiber, and further acts to reduce devitrification. From this viewpoint, the $Na_2O$ content may be 0.01% or more, 0.05% or more, or even 0.1% or more. However, addition of $Na_2O$ needs to be kept within a limited range so as not to increase the permittivity of the glass composition. The $Na_2O$ content is preferably 1.5% or less, 1% or less, 0.5% or less, and more preferably 0.4% or less, and may be, in some cases, 0.2% or less, even 0.15% or less, particularly 0.1% or less, 0.05% or less, or 0.01% or less. An example of a preferred range of the $Na_2O$ content is 0.01 to 0.4%.

($K_2O$)

$K_2O$ is also an optional component that, even when added in a small amount, acts to decrease the viscosity of the glass composition at melting to reduce inclusion of bubbles in the glass fiber, and further acts to reduce devitrification. However, $K_2O$ significantly acts to increase the permittivity of the glass composition. The $K_2O$ content is preferably 1% or less, 0.5% or less, and 0.2% or less, and may be, in some cases, 0.1% or less, 0.05% or less, or 0.01% or less. The glass composition may be substantially free of $K_2O$.

($R_2O$)

The total of the $R_2O$ content and the $Li_2O$, $Na_2O$, and $K_2O$ contents is preferably 5% or less, 4% or less, 3% or less, 2% or less, and more preferably 1.5% or less, and may be, in some cases, 1% or less, even 0.6% or less, or 0.5% or less. Although the components constituting $R_2O$ are each individually an optional component, it is preferable that at least one of the components should be contained, that is, the total of the contents of the components should exceed 0%. The $R_2O$ content is preferably 0.03% or more, 0.05% or more, more preferably 0.1% or more, particularly preferably 0.15% or more, and 0.2% or more.

Further, in the case where the $Li_2O$ content is higher than the $Na_2O$ content, the tendency for the glass composition to undergo phase separation may be more effectively reduced.

When the $Li_2O$ content is set to 0.25% or more or even 0.3% or more, the characteristic temperature sometimes can be adjusted to fall within a more preferred range. In particular, in the case where the first combination of the $SiO_2$ and $B_2O_3$ contents is employed, it is preferable to add $Li_2O$ such that the $Li_2O$ content is 0.25% or more or even 0.3% or more. In this case, $Na_2O$ may be added such that the $Na_2O$ content is 0.05% or more and less than the $Li_2O$ content.

($T\text{-}Fe_2O_3$)

$T\text{-}Fe_2O_3$ is an optional component that improves the meltability of the glass raw material owing to its heat absorbing action, and improves the homogeneity of the glass composition at melting. The effect of homogeneity improvement by $T\text{-}Fe_2O_3$ reduces occurrence of fiber breakage of a glass fiber during fiber forming even when the glass fiber to be formed has a small fiber diameter, thereby improving the forming workability. The $T\text{-}Fe_2O_3$ content is preferably 0.01% or more, 0.02% or more, 0.05% or more, and more preferably 0.10% or more. The effect of improving the meltability is remarkably exhibited when the $T\text{-}Fe_2O_3$ content is 0.01% or more. Meanwhile, the effect of improving the homogeneity is particularly remarkably exhibited when the $T\text{-}Fe_2O_3$ content is 0.02% or more. For the purpose of, for example, reducing an excessive heat absorbing action exhibited by $T\text{-}Fe_2O_3$, the $T\text{-}Fe_2O_3$ content is preferably 0.5% or less, 0.3% or less, and more preferably 0.25% or less, and may be 0.20% or less in some cases. In the present specification, as is conventional, the amount of total iron oxide in the glass composition is expressed as a value obtained by converting iron oxides other than $Fe_2O_3$ such as FeO into $Fe_2O_3$, that is, as the $T\text{-}Fe_2O_3$ content. Accordingly, at least a portion of $T\text{-}Fe_2O_3$ may be contained as FeO. An example of a preferred range of the $T\text{-}Fe_2O_3$ content is 0.01 to 0.5%, and even 0.1 to 0.3%.

(ZnO)

ZnO is an optional component that improves the meltability of the glass raw material to decrease the viscosity of the glass composition at melting. However, ZnO increases the permittivity of the glass composition. The ZnO content is preferably 3.5% or less, 2% or less, 1% or less, and more preferably 0.5% or less. The glass composition may be substantially free of ZnO.

(Additional Components)

Example of components that can be contained in the glass composition, in addition to the above components, include $P_2O_5$, BaO, PbO, $TiO_2$, $ZrO_2$, $La_2O_3$, $Y_2O_3$, $MoO_3$, $WO_3$, $Nb_2O_5$, $Cr_2O_3$, $SnO_2$, $CeO_2$, $As_2O_3$, $Sb_2O_3$, and $SO_3$. Other components that can be contained in the glass composition include, for example, noble metal elements such as Pt, Rh, and Os, and, for example, halogen elements such as F and Cl. The allowable content of each of these components is preferably less than 2%, more preferably less than 1%, and particularly preferably less than 0.5%, and the total content of the components is preferably less than 5%, more preferably less than 3%, particularly preferably less than 2%, and more particularly preferably less than 1%. However, the glass composition may be substantially free of each of the above additional components. Although a minute amount of $TiO_2$ may be added for the reasons described below, the glass composition may be substantially free of $TiO_2$. The same applies to $ZrO_2$. In addition, it is preferable that the glass composition should be substantially free of BaO and PbO. It is also preferable that the glass composition should be substantially free of $P_2O_5$. This is because BaO and PbO have a great effect of increasing the permittivity of the glass composition, and $P_2O_5$ induces phase separation. The glass composition may be substantially free of components other than the components from $SiO_2$ to ZnO listed above. However, even in this case, the glass composition may contain components that are effective in facilitating refining at melting, preferably $SO_3$, F, and Cl that are each within a range less than 2%.

It has been found that addition of a minute amount of $TiO_2$ sometimes decreases the permittivity and the dielectric loss tangent of the glass composition, contrary to technical common sense of a person skilled in the art. From this viewpoint, the $TiO_2$ content may be more than 0% and 1% or less. In particular, in the case where the sixth combination of the $SiO_2$ and $B_2O_3$ contents is employed, $TiO_2$ may be added at a content of more than 0% and 1% or less.

Example of Preferred Composition

In a preferred embodiment, the glass composition of the present invention includes the following components:
$40 \leq SiO_2 < 58$;
$25 \leq B_2O_3 \leq 40$;
$7.5 \leq Al_2O_3 \leq 18$;
$0 < R_2O \leq 4$;
$0 \leq Li_2O \leq 1.5$;
$0 \leq Na_2O \leq 1.5$;
$0 \leq K_2O \leq 1$;
$1 \leq RO < 10$;
$0 \leq MgO < 10$;
$0 \leq CaO < 10$;
$0 \leq SrO \leq 5$; and
$0 \leq T\text{-}Fe_2O_3 \leq 0.5$.

In an embodiment including the above components, the following may be satisfied:
$7.5 \leq Al_2O_3 \leq 15$; and
$0 \leq SrO \leq 1$.

A glass composition in which the following is added to the end of the above relationships is also another preferred embodiment:
$0 \leq ZnO \leq 3.5$.

The glass compositions of these embodiments preferably further satisfy $40 \leq SiO_2 < 55$. Also, the glass compositions may satisfy $SiO_2 + B_2O_3 \geq 80$, and may preferably further satisfy $SiO_2 + B_2O_3 + Al_2O_3 \leq 99.9$. MgO/RO<0.8 is also other conditions that the glass compositions of the above embodiments may satisfy.

[Properties]

(Permittivity)

In a preferred embodiment, the permittivity of the glass composition according to the present invention at a measurement frequency of 1 GHz is 4.65 or less, 4.4 or less, 4.35 or less, 4.30 or less, 4.25 or less, or even 4.20 or less, and is 4.18 or less in some cases. The permittivity at a measurement frequency of 5 GHz is 4.63 or less, 4.4 or less, 4.31 or less, 4.27 or less, 4.22 or less, or even 4.17 or less, and is 4.15 or less in some cases. The permittivity at a measurement frequency of 10 GHz is 4.55 or less, 4.4 or less, 4.22 or less, 4.18 or less, 4.14 or less, or even 4.08 or less, and is 4.06 or less in some cases.

(Dielectric Loss Tangent: Tan δ)

In a preferred embodiment, the dielectric loss tangent of the glass composition according to the present invention at a measurement frequency of 1 GHz is 0.007 or less, 0.005 or less, 0.004 or less, or even 0.003 or less, and is 0.002 or less in some cases. The dielectric loss tangent at a measurement frequency of 1 GHz may be 0.001 or less, less than 0.001, 0.0009 or less, 0.0008 or less, or even 0.0007 or less. The dielectric loss tangent at a measurement frequency of 5 GHz is 0.007 or less, 0.005 or less, 0.004 or less, or even 0.003 or less, and is 0.002 or less in some cases. The dielectric loss tangent at a measurement frequency of 10 GHz is 0.007 or less, 0.006 or less, 0.005 or less, 0.004 or less, or even 0.003 or less, and is 0.002 or less in some cases.

(Characteristic Temperature)

In a preferred embodiment, T2 of the glass composition according to the present invention is 1700° C. or less, 1650° C. or less, 1640° C. or less, 1620° C. or less, or even 1610° C. or less, and is, in some cases, less than 1600° C., 1550° C. or less, even 1520° C. or less, or particularly 1510° C. or less. T2 is a temperature serving as the reference for the melting temperature of the glass melt. An excessively high T2 requires an extremely high temperature for melting the glass melt, and thus causes a high energy cost and a high cost of apparatuses resistant to high temperatures. When molten at the same temperature, a glass having a lower T2 has a lower viscosity of the melt, and accordingly is effective in refining and homogenizing the glass melt. Meanwhile, when molten at the same viscosity, a glass having a lower T2 can be molten at a lower temperature, and accordingly is suitable for mass production. T2.5 is preferably 1590° C. or less, 1550° C. or less, and more preferably 1500° C. or less, and is, in some cases, 1450° C. or less, or even 1400° C. or less. T3 is preferably 1450° C. or less, 1420° C. or less, 1400° C. or less, more preferably 1365° C. or less, and particularly preferably 1360° C. or less, and is, in some cases, 1330° C. or less, or even 1300° C. or less. T3 is a temperature serving as the reference for the forming temperature of a glass fiber. An excessively high T3 increases $B_2O_3$ volatilizing from glass on tips of a bushing and depositing on the tips, and thus may increase a risk of a so-called fiber breaking.

In a preferred embodiment, T3 of the glass composition according to the present invention is higher than the devitrification temperature TL. In addition, in a more preferred embodiment, T3 is higher than TL by 10° C. or more, by even 50° C. or more, and, in some cases, by 100° C. or more. In a preferred embodiment, T2.5 of the glass composition according to the present invention is higher than the devitrification temperature TL by 50° C. or more. In addition, in a more preferred embodiment, T2.5 is higher than TL by 100° C. or more. T3 and T2.5 that are sufficiently higher than TL significantly contribute to the stable production of a glass fiber.

The fifth combination of the $SiO_2$ and $B_2O_3$ contents is particularly suitable for achieving a preferred characteristic temperature. The preferred characteristic temperature is, for example, T2 that is 1520° C. or less, particularly 1510° C. or less, and is also, for example, T3 that is 1300° C. or less and higher than TL. A glass composition having an $Li_2O$ content of 0.25% or more in the first combination of the $SiO_2$ and $B_2O_3$ contents is also suitable as much as the above for achieving the preferred characteristic temperature.

[Applications]

The applications of the glass composition according to the present invention are not limited. Application examples include a glass fiber and shaped glass materials. Examples of the shaped glass materials include a glass flake. That is, the glass composition of the present invention can be a glass composition for a glass fiber, a glass composition for shaped glass materials, or a glass composition for a glass flake.

The glass composition according to the present invention is a glass composition with which occurrence of devitrification and inclusion of bubbles in a glass fiber to be formed can be further reduced even when the glass fiber has a small fiber diameter. Here, the phrase "glass fiber having a small fiber diameter" means, for example, a glass fiber having an average fiber diameter of 1 to 6 μm. That is, the glass composition according to the present invention can be a glass composition for a small-diameter glass fiber, and more specifically, can be a glass composition for a glass fiber having an average fiber diameter of 1 to 6 μm. In addition, as described above, the effect of the present invention becomes more remarkable when a glass fiber produced from the glass composition according to the present invention is used in printed boards. From this viewpoint, the glass composition according to the present invention can be a glass composition for a glass fiber for use in printed boards (printed wiring boards and printed circuit boards).

Likewise, the glass composition according to the present invention is a glass composition with which occurrence of devitrification and inclusion of bubbles in a shaped glass material to be formed such as a glass flake can be further reduced even when the shaped glass material has a small thickness. Here, the term "small thickness" means, for example, 0.1 to 2.0 μm. In addition, as described above, the effect of the present invention becomes more remarkable when a shaped glass material produced from the glass composition of the present invention (a shaped glass material formed of the glass composition according to the present invention) is used in printed boards. From this viewpoint, the glass composition according to the present invention can be a glass composition for shaped glass materials for use in printed boards.

In view of the usability in printed boards, the glass composition according to the present invention can be a glass composition for printed boards.

[Glass Fiber]

The glass fiber according to the present invention are formed of the glass composition according to the present invention. The details of the glass fiber are not particularly limited, and the glass fiber can be constituted in the same manner as conventional glass fibers as long as the glass fiber is formed of the glass composition according to the present invention. As described above, the glass composition according to the present invention is a low-permittivity glass composition with which occurrence of devitrification and inclusion of bubbles in a glass fiber to be formed can be further reduced even when the glass fiber has a small fiber diameter, and thus the glass fiber according to the present invention can be a glass fiber having a small fiber diameter. Also, such a fiber having a low permittivity and a small fiber diameter is an embodiment of the glass fiber according to the present invention.

The average fiber diameter of the glass fiber may be, for example, 1 to 10 μm or even 6 to 10 μm, or may be 1 to 6 μm. The average fiber diameter may be 3 μm or more, or may be 10 μm or less, 5.1 μm or less, 4.6 μm or less, or even 4.3 μm or less. A glass composition having characteristic temperatures suitable for mass production is suitable for stable production of a thin glass fiber. In a preferred embodiment, the average fiber diameter is even smaller, and is, for example, 3.9 μm or less, or even 3.5 μm or less. The glass fiber is, for example, a continuous glass fiber (filament).

Preferred applications of the glass fiber according to the present invention include printed boards. A glass fiber having a low permittivity and a small fiber diameter is suitable for use in printed boards. However, the applications are not limited to printed boards.

The glass fiber can be formed into a glass yarn. The glass yarn can include a glass fiber other than the glass fiber according to the present invention, and may be formed only of the glass fiber according to the present invention, specifically that in the form of a continuous glass fiber. This glass yarn has a reduced occurrence of a defect such as fiber breakage or fluffing of the glass fiber, and exhibits a high productivity.

The number of continuous glass fibers (the number of filaments) included in a glass yarn is, for example, 30 to 400.

In the case of use in printed boards, the number of filaments may be, for example, 30 to 120, 30 to 70, or even 30 to 60. An appropriate number is advantageous in forming a glass cloth more easily and reliably and achieving a thinner printed board. However, the structure and applications of the glass yarn are not limited to these examples.

The glass yarn including the glass fiber may have a count of, for example, 0.7 to 6 tex, 0.9 to 5 tex, even 1 to 4 tex, even 1 to 3 tex, or 10 to 70 tex. An appropriate count is advantageous in forming a thin glass cloth more easily and reliably and achieving a thinner printed board.

The glass yarn may have a strength of 0.4 N/tex or more, even 0.6 N/tex or more, or particularly 0.7 N/tex or more.

The glass fiber according to the present invention can be produced by applying a known method. For example, when a glass fiber having an average fiber diameter of about 1 to 6 μm is produced, the following exemplary method can be employed. Specifically, the glass composition according to the present invention is placed in a glass melting furnace and molten into molten glass, and then the molten glass is drawn through a large number of forming nozzles provided at the bottom of a heat-resistant bushing of a drawing furnace, and thus to be shaped into fibers. In this manner, the glass fiber formed of the glass composition according to the present invention can be produced. The glass fiber can be a continuous glass fiber (filament). The melting temperature in the melting furnace is, for example, 1300 to 1700° C., preferably 1400 to 1700° C., and more preferably 1500 to 1700° C. In these cases, even when a glass fiber to be formed has a small fiber diameter, occurrence of fine devitrification and inclusion of bubbles in the glass fiber can be further reduced and, in addition, an excessive increase in forming tension can be prevented, so that the properties (such as strength) and the quality of the resulting glass fiber are reliably ensured.

To produce a glass fiber having a small fiber diameter, the following approaches are also possible, including an approach of increasing the drawing rate of molten glass from a drawing furnace and an approach of decreasing the temperature of forming nozzles. However, the former approach sometimes fails to allow a sufficient time for facilitating defoaming of molten glass in the drawing furnace. This may cause, for example, fiber breakage during fiber forming due to inclusion of bubbles, or a decrease in strength of a fiber. Additionally, the increase in drawing rate entails an increase in the tension (forming tension) acting on a fiber during fiber forming, and this increased tension may also cause fiber breakage during fiber forming, a decrease in strength of the fiber, a degradation in quality of the fiber, and the like. To wind a glass fiber, a winding rotary apparatus called collet is used usually. An excessive increase in forming tension causes the wound glass fiber to have kinks due to recesses between fingers, and this leads to a degradation in quality of the glass fiber. Note that the collet is an apparatus provided with a plurality of fingers on the outer periphery of its main body, and the fingers move outwardly in the radial direction of the collet during rotation of the collet, and sink into the main body of the collet while the collet is at rest. The degradation in quality of the glass fiber may lead to, for example, poor appearance and/or fiber-opening failure of a glass cloth. Meanwhile, the latter approach requires decreasing the melting temperature in the melting furnace as well. This makes the melting temperature closer to the devitrification temperature of the glass composition, and accordingly increases the viscosity of the molten glass, which may fail to perform sufficient defoaming. The forming tension also increases with the increase in viscosity, and thus the above problems may occur.

By using the glass composition according to the present invention for melting in the above temperature ranges, it is possible to alleviate the above problems. An improvement in quality of a glass fiber results in good appearance and/or high degree of fiber opening of a glass cloth produced using the glass fiber.

A glass strand can be formed by applying a sizing agent to the surfaces of formed glass fibers and bundling together a plurality of such glass fibers, for example, 10 to 120 glass fibers. This strand includes the glass fiber according to the present invention. A glass yarn can be formed by winding the strands around a tube (for example, a paper tube) on a collet rotating at a high speed to form a cake, then unwinding the strands from the outer layer of the cake, twisting the strands under air drying, winding the strands around a bobbin or the like, and further twisting the strands.

[Glass Cloth]

The glass cloth according to the present invention is formed of the glass fiber according to the present invention. The glass cloth according to the present invention can also have the above properties, such as a low permittivity, the glass composition according to the present invention has. The weave of the glass cloth according to the present invention is, for example, plain weave, satin weave, twill weave, mat weave, or rib weave, and is preferably plain weave. However, the weave is not limited to these examples. A glass cloth can include a glass fiber other than the glass fiber according to the present invention, but may be formed only of the glass fiber according to the present invention, specifically that in the form of a continuous glass fiber. The glass cloth according to the present invention has a reduced occurrence of a defect such as fiber breakage or fluffing of the glass fiber, and also exhibits a high productivity.

In a preferred embodiment, the thickness of the glass cloth is preferably 200 μm or less, more preferably 7 to 150 μm, even more preferably 7 to 30 μm, and particularly preferably 8 to 15 μm, as expressed by a thickness measured according to 7.10.1 of JIS R 3420: 2013. The glass cloth of the preferred embodiment is suitable for achieving a thinner printed board.

In a preferred embodiment, the mass of the glass cloth is preferably 250 g/m$^2$ or less, more preferably 150 g/m$^2$ or less, even more preferably 50 g/m$^2$, and particularly preferably 15 g/m$^2$ or less, as expressed by a cross mass measured according to 7.2 of JIS R 3420: 2013. The glass cloth of the preferred embodiment is suitable for use in thinner printed boards.

In a preferred embodiment, the number of glass fibers per unit length (25 mm) in the glass cloth (weave density) is, for example, preferably 40 to 130, more preferably 60 to 120, and even more preferably 90 to 120, per 25 mm for both warps and wefts. The glass cloth of the preferred embodiment is suitable for reducing its thickness, and increasing the number of interlacing points between warps and wefts to reduce the likelihood of bias or bowed filling of the glass cloth to reduce generation of pinholes in impregnation with a resin.

In a preferred embodiment, the air permeability of the glass cloth is, for example, 400 cm$^3$/(cm$^2$·sec) or less, preferably 300 cm$^3$/(cm$^2$·sec) or less, and more preferably 250 cm$^3$/(cm$^2$·sec) or less. The glass cloth of the preferred embodiment is suitable for reducing its thickness to reduce the generation of pinholes described above. To achieve fiber opening that allows the glass cloth to have an air permeability similar to the above, the glass fiber may be obtained by applying the melting temperature described above, that is, 1400° C. or more, preferably 1400 to 1650° C., to the glass composition according to the present invention, or to a glass raw material prepared such that the glass composition according to the present invention is obtained from the glass raw material.

The glass cloth according to the present invention can be produced using the glass fiber according to the present invention by a known method. One of exemplary producing methods is a method in which glass yarns are subjected to warping and sizing, and then the resulting glass yarns are used as warp yarns, between which other glass yarns are inserted as weft yarns. For weft insertion, various weaving machines can be used, such as a jet loom, a Sulzer loom, and a rapier loom. Specific examples of the jet loom include an air-jet loom and a water-jet loom. However, the weaving machine for producing the glass cloth is not limited to these.

The glass cloth according to the present invention may be subjected to fiber opening. Fiber opening is advantageous in achieving a thinner glass cloth. The details of the method for fiber opening are not particularly limited, and examples of applicable methods include fiber opening by pressure of water stream, fiber opening by high-frequency vibration using water or the like as a medium, and fiber opening by compression using rolls or the like. Examples of the water usable as the medium for fiber opening include degassed water, ion-exchanged water, deionized water, electrolyzed cation water, and electrolyzed anion water. Fiber opening may be performed simultaneously with or after weaving of the glass cloth. Also, the fiber opening may be performed simultaneously with or after other various treatments such as heat cleaning and surface treatment.

When a substance such as a sizing agent remains attached to the woven glass cloth, a removal treatment on the substance, typified by heat cleaning treatment, may be performed additionally. When used in printed boards, the glass cloth subjected to the removal treatment exhibits an excellent impregnability with a matrix resin and an excellent adhesion to the resin. After or separately from the removal treatment, the woven glass cloth may be subjected to a surface treatment with a silane coupling agent or the like. The surface treatment can be performed by a known method, specifically by a method in which a silane coupling agent is impregnated into, spread over, or sprayed onto the glass cloth.

The glass cloth according to the present invention is suitable for printed boards. In the case of use in printed boards, it is possible to effectively utilize the feature of the glass cloth that can be formed of a glass fiber having a low permittivity and a small fiber diameter. However, the applications are not limited to printed boards.

[Prepreg]

The prepreg according to the present invention can be formed of the glass cloth according to the present invention. The prepreg according to the present invention can also have the above properties, such as a low permittivity, the glass composition according to the present invention has. The method for producing the prepreg of the present invention is not particularly limited, and any conventionally known producing method may be employed. A resin to be impregnated into the prepreg according to the present invention is not particularly limited as long as it is a synthetic resin that can be composited with the glass cloth of the present invention. Examples of the resin include thermosetting resins, thermoplastic resins, and composite resins thereof. It is desirable to use a resin having a low permittivity corresponding to a low permittivity of the glass cloth according to the present invention.

[Printed Board]

The printed board according to the present invention can be formed of the glass cloth according to the present invention. The printed board according to the present invention can also have the above properties, such as a low permittivity, the glass composition according to the present invention has. The method for producing the board of the present invention is not particularly limited, and any conventionally known producing method may be employed. In an exemplary producing method, a prepreg including a resin impregnated into a glass cloth is produced and then is cured.

EXAMPLES

Hereinafter, the present invention will be described in more detail by Examples. The present invention is not limited to the following Examples.

Glass raw materials were weighed to give each composition shown in Tables 1 to 6 (the contents of the components are expressed in wt %), and were mixed to homogeneity. Thus, a glass raw material mixture batch was produced. Next, the produced mixture batch was introduced into a crucible made of platinum-rhodium alloy, and heated in an indirect-heating electric furnace set at 1600° C. in an air atmosphere for 3 hours or more to obtain a molten glass. Next, the obtained molten glass was poured into a fire-resistant mold to be cast-molded. The resulting shaped body was then cooled slowly to room temperature by an annealing furnace to obtain glass composition samples to be used for evaluation.

The glass samples thus produced were evaluated for the characteristic temperatures T2, T2.5, and T3, the devitrification temperature TL, and the permittivity and the dielectric loss tangent at frequencies of 1 GHz, 5 GHz, and 10 GHz. The evaluation method is as follows.

(Characteristic Temperature)

The viscosity was measured by a platinum ball-drawing method, and respective temperatures at which the viscosity was $10^2$ dPa·s, $10^{2.5}$ dPa·s, and $10^3$ dPa·s were determined as T2, T2.5, and T3, respectively.

(Devitrification Temperature)

The glass specimens were each crushed into particles, and the particles were sieved to obtain particles passing through a sieve with an aperture size of 2.83 mm and remaining in a sieve with an aperture size of 1.00 mm. The particles were washed to remove fine powder deposited on the particles, and dried to prepare a sample for devitrification temperature measurement. In a platinum boat (a lidless rectangular platinum container), 25 g of the sample for devitrification temperature measurement was put to have a substantially uniform thickness. After being held in a temperature-gradient furnace for 2 hours, the sample was taken out of the furnace. The highest temperature at which devitrification was observed inside the glass was determined as the devitrification temperature.

(Permittivity and Dielectric Loss Tangent)

The permittivity (dielectric constant) and the dielectric loss tangent at the respective frequencies were measured using a permittivity measuring apparatus by a cavity resonator perturbation method. The measurement temperature was set to 25° C., and the dimensions of the sample for measurement were set to a rectangular parallelepiped with a length of 10 cm having a square bottom surface of side 1.5 cm.

The glass compositions of Examples 1 to 44 and 48 to 99 had a permittivity of 4.65 or less at a measurement frequency of 1 GHz, and had T2 of 1700° C. or less and T3 of 1450° C. or less. Some of these glass compositions had a permittivity of 4.4 or less at a measurement frequency of 1 GHz, and the glass compositions of Examples 1 to 43, 48 to 81, 83 to 84, and 93 to 99 had a permittivity of 4.36 or less at a measurement frequency of 1 GHz. The glass compositions of Examples 1 to 41, 48 to 81, 83 to 84, and 94 to 99 had a permittivity of 4.35 or less at a measurement frequency of 1 GHz. Further, the glass compositions of Examples 5 to 6, 66 to 67, and 83 to 92 had T2 of 1520° C. or less and T3 of 1300° C. or less that were higher than TL.

The glass compositions of Examples 66 to 67 and 83 to 92 had a $B_2O_3$ content of 35% or less, or 30% or less in some cases, and had T2 of 1520° C. or less and T3 of 1300° C. or less that were higher than TL. The glass compositions of Examples 2 and 93 to 99 had a dielectric loss tangent of less than 0.001 at a frequency of 1 GHz. The glass compositions of Examples 93 to 99 had a dielectric loss tangent of less than 0.001 at a frequency of 1 GHz, and had T2 of less than 1600° C. The glass compositions of Examples 45 to 47 are comparative examples, and Example 45 had T2 of more than 1700° C. and Examples 46 to 47 had a permittivity of more than 4.7 at a measurement frequency of 1 GHz.

TABLE 1

| wt % | Sample No. | | | | | | | |
|---|---|---|---|---|---|---|---|---|
| | 1 | 2 | 3 | 4 | 5 | 6 | 7 | 8 |
| $SiO_2$ | 55.01 | 55.20 | 57.01 | 53.21 | 46.21 | 48.01 | 51.21 | 51.21 |
| $B_2O_3$ | 33.00 | 33.00 | 32.00 | 32.00 | 38.00 | 38.00 | 34.50 | 36.40 |
| $Al_2O_3$ | 6.00 | 6.00 | 5.00 | 5.00 | 7.00 | 7.00 | 7.00 | 8.00 |
| $Li_2O$ | 0.09 | 0.09 | 0.90 | 0.09 | 0.09 | 0.09 | 0.09 | 0.09 |
| $Na_2O$ | 0.09 | 0.09 | 0.30 | 0.09 | 0.09 | 0.09 | 0.09 | 0.09 |
| $K_2O$ | 0.00 | 0.00 | 0.00 | 0.00 | 0.00 | 0.00 | 0.00 | 0.00 |
| MgO | 4.17 | 4.11 | 2.05 | 6.87 | 5.87 | 4.07 | 4.37 | 1.47 |
| CaO | 1.45 | 1.45 | 2.55 | 2.55 | 2.55 | 2.55 | 2.55 | 2.55 |
| SrO | 0.00 | 0.00 | 0.00 | 0.00 | 0.00 | 0.00 | 0.00 | 0.00 |
| $TiO_2$ | 0.00 | 0.00 | 0.00 | 0.00 | 0.00 | 0.00 | 0.00 | 0.00 |
| $Fe_2O_3$ | 0.19 | 0.06 | 0.19 | 0.19 | 0.19 | 0.19 | 0.19 | 0.19 |
| $SiO_2 + B_2O_3 + Al_2O_3$ | 94.0 | 94.2 | 94.0 | 90.2 | 91.2 | 93.0 | 92.7 | 95.6 |
| $SiO_2 + B_2O_3$ | 88.0 | 88.2 | 89.0 | 85.2 | 84.2 | 86.0 | 85.7 | 87.6 |
| $(SiO_2 + B_2O_3 + Al_2O_3)/(SiO_2 + B_2O_3)$ | 1.07 | 1.07 | 1.06 | 1.06 | 1.08 | 1.08 | 1.08 | 1.09 |
| RO | 5.6 | 5.6 | 4.6 | 9.4 | 8.4 | 6.6 | 6.9 | 4.0 |
| $R_2O$ | 0.2 | 0.2 | 1.2 | 0.2 | 0.2 | 0.2 | 0.2 | 0.2 |
| MgO/RO | 0.74 | 0.74 | 0.45 | 0.73 | 0.70 | 0.61 | 0.63 | 0.37 |
| T2 (° C.) | 1617 | 1615 | 1639 | 1569 | 1465 | 1511 | 1555 | 1581 |
| T2.5 (° C.) | 1469 | 1471 | 1496 | 1416 | 1322 | 1368 | 1410 | 1441 |
| T3 (° C.) | 1348 | 1352 | 1363 | 1300 | 1218 | 1259 | 1297 | 1325 |
| Devitrification temperature TL (° C.) | <1160 | <1160 | <1160 | <1160 | <1160 | <1160 | <1160 | 1059 |
| Permittivity (1 GHz) | 4.08 | 4.07 | 4.19 | 4.33 | 4.31 | 4.18 | 4.21 | 4.03 |
| Dielectric loss tangent (1 GHz) | 0.0011 | 0.0008 | 0.0022 | 0.0010 | 0.0018 | 0.0018 | 0.0014 | 0.0016 |
| Permittivity (5 GHz) | 4.05 | 4.04 | 4.16 | 4.31 | 4.28 | 4.15 | 4.18 | 3.99 |
| Dielectric loss tangent (5 GHz) | 0.0009 | 0.0008 | 0.0005 | 0.0014 | 0.0010 | 0.0007 | 0.0011 | 0.0019 |
| Permittivity (10 GHz) | 3.95 | 3.94 | 4.06 | 4.22 | 4.19 | 4.05 | 4.09 | 3.89 |
| Dielectric loss tangent (10 GHz) | 0.0013 | 0.0011 | 0.0009 | 0.0007 | 0.0014 | 0.0012 | 0.0005 | 0.0023 |

| wt % | Sample No. | | | | | | |
|---|---|---|---|---|---|---|---|
| | 9 | 10 | 11 | 12 | 13 | 14 | 15 |
| $SiO_2$ | 51.91 | 51.20 | 51.91 | 50.75 | 50.88 | 51.72 | 52.39 |
| $B_2O_3$ | 31.00 | 31.00 | 31.00 | 34.88 | 33.91 | 33.34 | 31.88 |
| $Al_2O_3$ | 13.30 | 14.70 | 12.50 | 10.84 | 10.87 | 11.63 | 11.67 |
| $Li_2O$ | 0.30 | 0.30 | 0.30 | 0.09 | 0.09 | 0.09 | 0.09 |
| $Na_2O$ | 0.09 | 0.09 | 0.09 | 0.09 | 0.09 | 0.09 | 0.09 |
| $K_2O$ | 0.00 | 0.00 | 0.00 | 0.00 | 0.00 | 0.00 | 0.00 |
| MgO | 0.66 | 1.22 | 1.46 | 0.61 | 0.77 | 1.23 | 1.54 |
| CaO | 2.55 | 1.30 | 2.55 | 2.55 | 3.20 | 1.71 | 2.14 |
| SrO | 0.00 | 0.00 | 0.00 | 0.00 | 0.00 | 0.00 | 0.00 |
| $TiO_2$ | 0.00 | 0.00 | 0.00 | 0.00 | 0.00 | 0.00 | 0.00 |
| $Fe_2O_3$ | 0.19 | 0.19 | 0.19 | 0.19 | 0.19 | 0.19 | 0.20 |
| $SiO_2 + B_2O_3 + Al_2O_3$ | 96.2 | 96.9 | 95.4 | 96.5 | 95.7 | 96.7 | 95.9 |
| $SiO_2 + B_2O_3$ | 82.9 | 82.2 | 82.9 | 85.6 | 84.8 | 85.1 | 84.3 |
| $(SiO_2 + B_2O_3 + Al_2O_3)/(SiO_2 + B_2O_3)$ | 1.16 | 1.18 | 1.15 | 1.13 | 1.13 | 1.14 | 1.14 |
| RO | 3.2 | 2.5 | 4.0 | 3.2 | 4.0 | 2.9 | 3.7 |
| $R_2O$ | 0.4 | 0.4 | 0.4 | 0.2 | 0.2 | 0.2 | 0.2 |
| MgO/RO | 0.21 | 0.48 | 0.36 | 0.19 | 0.19 | 0.42 | 0.42 |
| T2 (° C.) | 1563 | 1536 | 1558 | 1557 | 1570 | 1571 | 1579 |
| T2.5 (° C.) | 1437 | 1416 | 1430 | 1432 | 1436 | 1440 | 1447 |

TABLE 1-continued

| | | | | | | | |
|---|---|---|---|---|---|---|---|
| T3 (° C.) | 1329 | 1312 | 1321 | 1325 | 1326 | 1331 | 1338 |
| Devitrification temperature TL (° C.) | 1317 | 1442 | 1191 | 1277 | <1160 | 1324 | 1250 |
| Permittivity (1 GHz) | 4.22 | 4.20 | 4.25 | 4.07 | 4.14 | 4.07 | 4.14 |
| Dielectric loss tangent (1 GHz) | 0.0019 | 0.0020 | 0.0019 | 0.0018 | 0.0017 | 0.0017 | 0.0016 |
| Permittivity (5 GHz) | 4.19 | 4.17 | 4.23 | 4.04 | 4.11 | 4.04 | 4.11 |
| Dielectric loss tangent (5 GHz) | 0.0029 | 0.0031 | 0.0024 | 0.0027 | 0.0024 | 0.0024 | 0.0021 |
| Permittivity (10 GHz) | 4.10 | 4.08 | 4.13 | 3.93 | 4.01 | 3.94 | 4.02 |
| Dielectric loss tangent (10 GHz) | 0.0034 | 0.0036 | 0.0028 | 0.0031 | 0.0029 | 0.0029 | 0.0025 |

TABLE 2

| wt % | Sample No. | | | | | | | | |
|---|---|---|---|---|---|---|---|---|---|
| | 16 | 17 | 18 | 19 | 20 | 21 | 22 | 23 | 24 |
| $SiO_2$ | 52.15 | 50.87 | 51.72 | 51.70 | 53.81 | 53.00 | 52.50 | 50.04 | 50.02 |
| $B_2O_3$ | 31.86 | 34.96 | 33.33 | 33.33 | 31.91 | 31.00 | 31.42 | 33.93 | 37.12 |
| $Al_2O_3$ | 11.99 | 10.86 | 11.62 | 11.62 | 10.90 | 12.00 | 12.14 | 12.10 | 9.32 |
| $Li_2O$ | 0.20 | 0.09 | 0.07 | 0.05 | 0.05 | 0.20 | 0.10 | 0.10 | 0.09 |
| $Na_2O$ | 0.10 | 0.09 | 0.14 | 0.19 | 0.19 | 0.10 | 0.13 | 0.13 | 0.09 |
| $K_2O$ | 0.00 | 0.00 | 0.00 | 0.00 | 0.00 | 0.00 | 0.00 | 0.00 | 0.00 |
| MgO | 1.50 | 1.23 | 1.23 | 1.22 | 1.23 | 1.50 | 0.53 | 0.53 | 0.61 |
| CaO | 2.00 | 1.71 | 1.70 | 1.70 | 1.71 | 2.00 | 2.98 | 2.97 | 2.56 |
| SrO | 0.00 | 0.00 | 0.00 | 0.00 | 0.00 | 0.00 | 0.00 | 0.00 | 0.00 |
| $TiO_2$ | 0.00 | 0.00 | 0.00 | 0.00 | 0.00 | 0.00 | 0.00 | 0.00 | 0.00 |
| $Fe_2O_3$ | 0.20 | 0.19 | 0.19 | 0.19 | 0.20 | 0.20 | 0.20 | 0.20 | 0.19 |
| $SiO_2 + B_2O_3 + Al_2O_3$ | 96.0 | 96.7 | 96.7 | 96.6 | 96.6 | 96.0 | 96.1 | 96.1 | 96.4 |
| $SiO_2 + B_2O_3$ | 84.0 | 85.8 | 85.0 | 85.0 | 85.7 | 84.0 | 83.9 | 84.0 | 87.1 |
| $(SiO_2 + B_2O_3 + Al_2O_3)/(SiO_2 + B_2O_3)$ | 1.14 | 1.13 | 1.14 | 1.14 | 1.13 | 1.14 | 1.15 | 1.14 | 1.11 |
| RO | 3.5 | 2.9 | 2.9 | 2.9 | 2.9 | 3.5 | 3.5 | 3.5 | 3.2 |
| $R_2O$ | 0.3 | 0.2 | 0.2 | 0.2 | 0.2 | 0.3 | 0.2 | 0.2 | 0.2 |
| MgO/RO | 0.43 | 0.42 | 0.42 | 0.42 | 0.42 | 0.43 | 0.15 | 0.15 | 0.19 |
| T2 (° C.) | 1560 | 1562 | 1570 | 1571 | 1594 | 1568 | 1592 | 1553 | 1566 |
| T2.5 (° C.) | 1428 | 1431 | 1437 | 1440 | 1462 | 1445 | 1461 | 1424 | 1431 |
| T3 (° C.) | 1320 | 1321 | 1329 | 1331 | 1350 | 1340 | 1351 | 1317 | 1318 |
| Devitrification temperature TL (° C.) | 1290 | 1295 | 1309 | 1329 | 1312 | 1280 | 1308 | 1310 | 1218 |
| Permittivity (1 GHz) | 4.17 | 4.04 | 4.07 | 4.07 | 4.06 | 4.17 | 4.17 | 4.15 | 4.01 |
| Dielectric loss tangent (1 GHz) | 0.0018 | 0.0018 | 0.0017 | 0.0017 | 0.0012 | 0.0017 | 0.0017 | 0.0020 | 0.0019 |
| Permittivity (5 GHz) | 4.13 | 4.01 | 4.04 | 4.04 | 4.02 | 4.14 | 4.14 | 4.12 | 3.97 |
| Dielectric loss tangent (5 GHz) | 0.0023 | 0.0025 | 0.0022 | 0.0020 | 0.0016 | 0.0022 | 0.0024 | 0.0027 | 0.0026 |
| Permittivity (10 GHz) | 4.04 | 3.91 | 3.91 | 3.94 | 3.92 | 4.04 | 4.04 | 4.02 | 3.87 |
| Dielectric loss tangent (10 GHz) | 0.0028 | 0.0029 | 0.0020 | 0.0024 | 0.0021 | 0.0022 | 0.0028 | 0.0032 | 0.0031 |

| wt % | Sample No. | | | | | | |
|---|---|---|---|---|---|---|---|
| | 25 | 26 | 27 | 28 | 29 | 30 | 31 |
| $SiO_2$ | 51.00 | 51.74 | 49.76 | 52.10 | 49.51 | 51.26 | 49.28 |
| $B_2O_3$ | 36.12 | 33.87 | 35.89 | 32.76 | 37.45 | 34.17 | 36.20 |
| $Al_2O_3$ | 9.33 | 10.85 | 10.82 | 11.61 | 7.84 | 9.38 | 9.36 |
| $Li_2O$ | 0.09 | 0.09 | 0.09 | 0.09 | 0.09 | 0.09 | 0.09 |
| $Na_2O$ | 0.09 | 0.09 | 0.09 | 0.09 | 0.10 | 0.10 | 0.09 |
| $K_2O$ | 0.00 | 0.00 | 0.00 | 0.00 | 0.00 | 0.00 | 0.00 |
| MgO | 0.61 | 0.61 | 0.61 | 0.61 | 0.93 | 0.93 | 0.92 |
| CaO | 2.57 | 2.56 | 2.55 | 2.55 | 3.88 | 3.87 | 3.86 |
| SrO | 0.00 | 0.00 | 0.00 | 0.00 | 0.00 | 0.00 | 0.00 |
| $TiO_2$ | 0.00 | 0.00 | 0.00 | 0.00 | 0.00 | 0.00 | 0.00 |
| $Fe_2O_3$ | 0.19 | 0.19 | 0.19 | 0.19 | 0.20 | 0.20 | 0.20 |
| $SiO_2 + B_2O_3 + Al_2O_3$ | 96.4 | 96.4 | 96.5 | 96.5 | 94.8 | 94.8 | 94.8 |
| $SiO_2 + B_2O_3$ | 87.1 | 85.6 | 85.6 | 84.8 | 87.0 | 85.4 | 85.5 |
| $(SiO_2 + B_2O_3 + Al_2O_3)/(SiO_2 + B_2O_3)$ | 1.11 | 1.13 | 1.13 | 1.14 | 1.09 | 1.11 | 1.11 |
| RO | 3.2 | 3.2 | 3.2 | 3.2 | 4.8 | 4.8 | 4.8 |
| $R_2O$ | 0.2 | 0.2 | 0.2 | 0.2 | 0.2 | 0.2 | 0.2 |
| MgO/RO | 0.19 | 0.19 | 0.19 | 0.19 | 0.19 | 0.19 | 0.19 |
| T2 (° C.) | 1581 | 1583 | 1552 | 1584 | 1567 | 1585 | 1554 |
| T2.5 (° C.) | 1445 | 1450 | 1421 | 1453 | 1427 | 1447 | 1417 |
| T3 (° C.) | 1331 | 1338 | 1312 | 1342 | 1313 | 1333 | 1306 |

TABLE 2-continued

|  |  |  |  |  |  |  |  |
|---|---|---|---|---|---|---|---|
| Devitrification temperature TL (° C.) | 1218 | 1276 | 1277 | 1305 | <1160 | <1160 | <1160 |
| Permittivity (1 GHz) | 4.01 | 4.07 | 4.06 | 4.10 | 4.09 | 4.16 | 4.15 |
| Dielectric loss tangent (1 GHz) | 0.0018 | 0.0017 | 0.0019 | 0.0016 | 0.0018 | 0.0017 | 0.0019 |
| Permittivity (5 GHz) | 3.98 | 4.04 | 4.03 | 4.07 | 4.06 | 4.13 | 4.12 |
| Dielectric loss tangent (5 GHz) | 0.0025 | 0.0025 | 0.0028 | 0.0025 | 0.0021 | 0.0020 | 0.0023 |
| Permittivity (10 GHz) | 3.88 | 3.94 | 3.93 | 3.97 | 3.96 | 4.03 | 4.02 |
| Dielectric loss tangent (10 GHz) | 0.0030 | 0.0030 | 0.0033 | 0.0030 | 0.0026 | 0.0025 | 0.0028 |

TABLE 3

| wt % | Sample No. | | | | | | | | |
|---|---|---|---|---|---|---|---|---|---|
|  | 32 | 33 | 34 | 35 | 36 | 37 | 38 | 39 | 40 |
| $SiO_2$ | 51.12 | 51.87 | 49.89 | 50.65 | 49.23 | 55.30 | 56.50 | 57.45 | 52.83 |
| $B_2O_3$ | 35.15 | 32.90 | 34.92 | 35.46 | 42.56 | 28.25 | 29.17 | 26.36 | 30.54 |
| $Al_2O_3$ | 9.36 | 10.88 | 10.85 | 7.87 | 6.23 | 11.20 | 12.37 | 12.22 | 13.11 |
| $Li_2O$ | 0.09 | 0.09 | 0.09 | 0.09 | 0.09 | 0.10 | 0.09 | 0.10 | 0.09 |
| $Na_2O$ | 0.09 | 0.09 | 0.09 | 0.10 | 0.09 | 0.14 | 0.09 | 0.14 | 0.09 |
| $K_2O$ | 0.00 | 0.00 | 0.00 | 0.00 | 0.00 | 0.00 | 0.00 | 0.00 | 0.00 |
| MgO | 0.77 | 0.77 | 0.77 | 1.09 | 0.31 | 0.54 | 0.31 | 0.53 | 0.61 |
| CaO | 3.22 | 3.21 | 3.20 | 4.54 | 1.29 | 4.27 | 1.28 | 3.00 | 2.54 |
| SrO | 0.00 | 0.00 | 0.00 | 0.00 | 0.00 | 0.00 | 0.00 | 0.00 | 0.00 |
| $TiO_2$ | 0.00 | 0.00 | 0.00 | 0.00 | 0.00 | 0.00 | 0.00 | 0.00 | 0.00 |
| $Fe_2O_3$ | 0.20 | 0.19 | 0.19 | 0.20 | 0.20 | 0.20 | 0.19 | 0.20 | 0.19 |
| $SiO_2 + B_2O_3 + Al_2O_3$ | 95.6 | 95.6 | 95.7 | 94.0 | 98.0 | 94.7 | 98.0 | 96.0 | 96.5 |
| $SiO_2 + B_2O_3$ | 86.3 | 84.8 | 84.8 | 86.1 | 91.8 | 83.5 | 85.7 | 83.8 | 83.4 |
| $(SiO_2 + B_2O_3 + Al_2O_3)/(SiO_2 + B_2O_3)$ | 1.11 | 1.13 | 1.13 | 1.09 | 1.07 | 1.13 | 1.14 | 1.15 | 1.16 |
| RO | 4.0 | 4.0 | 4.0 | 5.6 | 1.6 | 4.8 | 1.6 | 3.5 | 3.2 |
| $R_2O$ | 0.2 | 0.2 | 0.2 | 0.2 | 0.2 | 0.2 | 0.2 | 0.2 | 0.2 |
| MgO/RO | 0.19 | 0.19 | 0.19 | 0.19 | 0.19 | 0.11 | 0.19 | 0.15 | 0.19 |
| T2 (° C.) | 1583 | 1585 | 1554 | 1584 | 1574 | 1642 | 1650 | 1669 | 1586 |
| T2.5 (° C.) | 1446 | 1451 | 1422 | 1442 | 1434 | 1506 | 1518 | 1534 | 1458 |
| T3 (° C.) | 1332 | 1339 | 1312 | 1327 | 1315 | 1390 | 1402 | 1418 | 1349 |
| Devitrification temperature TL (° C.) | <1160 | 1198 | 1199 | <1160 | 1257 | <1160 | 1487 | 1305 | 1363 |
| Permittivity (1 GHz) | 4.09 | 4.15 | 4.14 | 4.17 | 3.74 | 4.26 | 4.01 | 4.19 | 4.17 |
| Dielectric loss tangent (1 GHz) | 0.0017 | 0.0016 | 0.0018 | 0.0017 | 0.0020 | 0.0013 | 0.0012 | 0.0011 | 0.0016 |
| Permittivity (5 GHz) | 4.05 | 4.12 | 4.11 | 4.14 | 3.70 | 4.23 | 3.98 | 4.16 | 4.14 |
| Dielectric loss tangent (5 GHz) | 0.0023 | 0.0023 | 0.0026 | 0.0018 | 0.0029 | 0.0016 | 0.0024 | 0.0017 | 0.0026 |
| Permittivity (10 GHz) | 3.95 | 4.02 | 4.01 | 4.05 | 3.59 | 4.14 | 3.87 | 4.07 | 4.04 |
| Dielectric loss tangent (10 GHz) | 0.0027 | 0.0028 | 0.0030 | 0.0022 | 0.0034 | 0.0021 | 0.0029 | 0.0021 | 0.0030 |

| wt % | Sample No. | | | | | | |
|---|---|---|---|---|---|---|---|
|  | 41 | 42 | 43 | 44 | 45 | 46 | 47 |
| $SiO_2$ | 40.46 | 51.99 | 53.23 | 52.00 | 62.00 | 52.00 | 38.00 |
| $B_2O_3$ | 41.56 | 27.00 | 25.81 | 25.00 | 25.00 | 27.00 | 35.00 |
| $Al_2O_3$ | 12.94 | 17.06 | 17.06 | 16.00 | 8.00 | 10.00 | 15.00 |
| $Li_2O$ | 0.09 | 0.10 | 0.10 | 0.10 | 0.10 | 0.10 | 0.10 |
| $Na_2O$ | 0.09 | 0.15 | 0.15 | 0.15 | 0.15 | 0.15 | 0.14 |
| $K_2O$ | 0.00 | 0.00 | 0.00 | 0.00 | 0.00 | 0.00 | 0.00 |
| MgO | 0.90 | 0.57 | 0.52 | 1.56 | 1.62 | 5.56 | 7.29 |
| CaO | 3.77 | 2.94 | 2.94 | 5.00 | 2.94 | 5.00 | 4.27 |
| SrO | 0.00 | 0.00 | 0.00 | 0.00 | 0.00 | 0.00 | 0.00 |
| $TiO_2$ | 0.00 | 0.00 | 0.00 | 0.00 | 0.00 | 0.00 | 0.00 |
| $Fe_2O_3$ | 0.19 | 0.19 | 0.19 | 0.19 | 0.19 | 0.19 | 0.20 |
| $SiO_2 + B_2O_3 + Al_2O_3$ | 95.0 | 96.1 | 96.1 | 93.0 | 95.0 | 89.0 | 88.0 |

TABLE 3-continued

|  |  |  |  |  |  |  |
|---|---|---|---|---|---|---|---|
| $SiO_2 + B_2O_3$ | 82.0 | 79.0 | 79.0 | 77.0 | 87.0 | 79.0 | 73.0 |
| $(SiO_2 + B_2O_3 + Al_2O_3)/(SiO_2 + B_2O_3)$ | 1.16 | 1.22 | 1.22 | 1.21 | 1.09 | 1.13 | 1.21 |
| RO | 4.7 | 3.5 | 3.5 | 6.6 | 4.6 | 10.6 | 11.6 |
| $R_2O$ | 0.2 | 0.2 | 0.2 | 0.2 | 0.2 | 0.2 | 0.2 |
| MgO/RO | 0.19 | 0.16 | 0.15 | 0.24 | 0.36 | 0.53 | 0.63 |
| T2 (° C.) | 1389 | 1553 | 1570 | 1550 | 1739 | 1540 | 1287 |
| T2.5 (° C.) | 1268 | 1435 | 1450 | 1426 | 1591 | 1398 | 1165 |
| T3 (° C.) | 1176 | 1335 | 1348 | 1325 | 1461 | 1291 | 1091 |
| Devitrification temperature TL (° C.) | 1216 | 1505 | 1506 | <1160 | 973 | <1160 | <1160 |
| Permittivity (1 GHz) | 4.24 | 4.36 | 4.36 | 4.58 | 4.13 | 4.72 | 5.04 |
| Dielectric loss tangent (1 GHz) | 0.0029 | 0.0018 | 0.0016 | 0.0016 | 0.0005 | 0.0012 | 0.0027 |
| Permittivity (5 GHz) | 4.21 | 4.34 | 4.34 | 4.57 | 4.10 | 4.71 | 5.04 |
| Dielectric loss tangent (5 GHz) | 0.0038 | 0.0028 | 0.0026 | 0.0016 | 0.0010 | 0.0009 | 0.0004 |
| Permittivity (10 GHz) | 4.12 | 4.25 | 4.25 | 4.48 | 4.00 | 4.64 | 4.97 |
| Dielectric loss tangent (10 GHz) | 0.0043 | 0.0032 | 0.0031 | 0.0021 | 0.0004 | 0.0013 | 0.0008 |

*Examples 45 to 47 are comparative examples.

TABLE 4

| wt % | Sample No. | | | | | | | | |
|---|---|---|---|---|---|---|---|---|---|
|  | 48 | 49 | 50 | 51 | 52 | 53 | 54 | 55 | 56 |
| $SiO_2$ | 54.00 | 54.00 | 53.00 | 54.00 | 52.84 | 52.47 | 52.71 | 52.32 | 52.84 |
| $B_2O_3$ | 30.00 | 31.00 | 29.35 | 30.00 | 30.91 | 30.70 | 30.83 | 30.89 | 30.91 |
| $Al_2O_3$ | 12.10 | 11.00 | 12.85 | 12.00 | 11.97 | 13.70 | 13.17 | 12.81 | 11.97 |
| $Li_2O$ | 0.10 | 0.10 | 0.12 | 0.20 | 0.20 | 0.20 | 0.36 | 0.20 | 0.20 |
| $Na_2O$ | 0.10 | 0.07 | 0.11 | 0.10 | 0.10 | 0.10 | 0.10 | 0.10 | 0.10 |
| $K_2O$ | 0.00 | 0.00 | 0.00 | 0.00 | 0.00 | 0.00 | 0.00 | 0.00 | 0.00 |
| MgO | 0.50 | 0.87 | 0.81 | 3.00 | 0.75 | 1.10 | 1.10 | 1.50 | 0.75 |
| CaO | 3.00 | 2.76 | 3.56 | 0.50 | 3.03 | 1.53 | 1.53 | 1.99 | 3.03 |
| SrO | 0.00 | 0.00 | 0.00 | 0.00 | 0.00 | 0.00 | 0.00 | 0.00 | 0.00 |
| $TiO_2$ | 0.00 | 0.00 | 0.00 | 0.00 | 0.00 | 0.00 | 0.00 | 0.00 | 0.00 |
| $Fe_2O_3$ | 0.20 | 0.20 | 0.20 | 0.20 | 0.20 | 0.20 | 0.20 | 0.19 | 0.20 |
| $SiO_2 + B_2O_3 + Al_2O_3$ | 96.1 | 96.0 | 95.2 | 96.0 | 95.7 | 96.9 | 96.7 | 96.0 | 95.7 |
| $SiO_2 + B_2O_3$ | 84.0 | 85.0 | 82.4 | 84.0 | 83.8 | 83.2 | 83.5 | 83.2 | 83.8 |
| $(SiO_2 + B_2O_3 + Al_2O_3)/(SiO_2 + B_2O_3)$ | 1.14 | 1.13 | 1.16 | 1.14 | 1.14 | 1.16 | 1.16 | 1.15 | 1.14 |
| RO | 3.5 | 3.6 | 4.4 | 3.5 | 3.8 | 2.6 | 2.6 | 3.5 | 3.8 |
| $R_2O$ | 0.2 | 0.2 | 0.2 | 0.3 | 0.3 | 0.3 | 0.5 | 0.3 | 0.3 |
| MgO/RO | 0.14 | 0.24 | 0.19 | 0.86 | 0.20 | 0.42 | 0.42 | 0.43 | 0.20 |
| T2 (° C.) | 1628 | 1675 | 1596 | 1593 | 1596 | 1573 | 1574 | 1567 | 1596 |
| T2.5 (° C.) | 1490 | 1518 | 1469 | 1463 | 1465 | 1448 | 1449 | 1439 | 1465 |
| T3 (° C.) | 1378 | 1395 | 1361 | 1354 | 1354 | 1342 | 1340 | 1331 | 1354 |
| Devitrification temperature TL (° C.) | 1283 | 1284 | 1261 | 1280 | 1267 | 1444 | 1381 | 1285 | 1267 |
| Permittivity (1 GHz) | 4.17 | 4.13 | 4.27 | 4.18 | 4.17 | 4.16 | 4.18 | 4.20 | 4.20 |
| Dielectric loss tangent (1 GHz) | 0.0012 | 0.0014 | 0.0016 | 0.0014 | 0.0013 | 0.0018 | 0.0020 | 0.0017 | 0.0017 |
| Permittivity (5 GHz) | 4.14 | 4.10 | 4.25 | 4.12 | 4.17 | 4.13 | 4.15 | 4.17 | 4.17 |
| Dielectric loss tangent (5 GHz) | 0.0024 | 0.0022 | 0.0022 | 0.0015 | 0.0025 | 0.0028 | 0.0029 | 0.0023 | 0.0025 |

TABLE 4-continued

|  |  |  |  |  |  |  |  |  |
|---|---|---|---|---|---|---|---|---|
| Permittivity (10 GHz) | 4.05 | 4.00 | 4.15 | 4.07 | 4.03 | 4.03 | 4.05 | 4.08 | 4.08 |
| Dielectric loss tangent (10 GHz) | 0.0023 | 0.0027 | 0.0027 | 0.0024 | 0.0022 | 0.0032 | 0.0033 | 0.0028 | 0.0029 |

| wt % | Sample No. | | | | | | |
|---|---|---|---|---|---|---|---|
|  | 57 | 58 | 59 | 60 | 61 | 62 | 63 |
| $SiO_2$ | 52.86 | 53.10 | 53.20 | 53.01 | 53.26 | 53.21 | 53.04 |
| $B_2O_3$ | 30.39 | 30.74 | 31.13 | 30.69 | 31.15 | 31.12 | 31.02 |
| $Al_2O_3$ | 12.75 | 12.02 | 11.48 | 12.00 | 10.96 | 10.94 | 11.69 |
| $Li_2O$ | 0.20 | 0.34 | 0.37 | 0.20 | 0.20 | 0.20 | 0.29 |
| $Na_2O$ | 0.10 | 0.10 | 0.10 | 0.10 | 0.10 | 0.10 | 0.10 |
| $K_2O$ | 0.00 | 0.00 | 0.00 | 0.00 | 0.00 | 0.00 | 0.00 |
| MgO | 1.50 | 1.50 | 1.51 | 1.38 | 1.51 | 1.24 | 1.11 |
| CaO | 2.00 | 2.00 | 2.01 | 2.42 | 2.62 | 2.99 | 2.55 |
| SrO | 0.00 | 0.00 | 0.00 | 0.00 | 0.00 | 0.00 | 0.00 |
| $TiO_2$ | 0.00 | 0.00 | 0.00 | 0.00 | 0.00 | 0.00 | 0.00 |
| $Fe_2O_3$ | 0.20 | 0.20 | 0.20 | 0.20 | 0.20 | 0.20 | 0.20 |
| $SiO_2 + B_2O_3 + Al_2O_3$ | 96.0 | 95.9 | 95.8 | 95.7 | 95.4 | 95.3 | 95.8 |
| $SiO_2 + B_2O_3$ | 83.3 | 83.8 | 84.3 | 83.7 | 84.4 | 84.3 | 84.1 |
| $(SiO_2 + B_2O_3 + Al_2O_3)/(SiO_2 + B_2O_3)$ | 1.15 | 1.14 | 1.14 | 1.14 | 1.13 | 1.13 | 1.14 |
| RO |  | 3.5 | 3.5 | 3.8 | 4.1 | 4.2 | 3.7 |
| $R_2O$ | 0.3 | 0.4 | 0.5 | 0.3 | 0.3 | 0.3 | 0.4 |
| MgO/RO | 0.43 | 0.43 | 0.43 | 0.36 | 0.37 | 0.29 | 0.30 |
| T2 (° C.) | 1583 | 1585 | 1587 | 1591 | 1601 | 1603 | 1591 |
| T2.5 (° C.) | 1454 | 1456 | 1448 | 1461 | 1467 | 1469 | 1455 |
| T3 (° C.) | 1346 | 1346 | 1334 | 1351 | 1355 | 1357 | 1345 |
| Devitrification temperature TL (° C.) | 1319 | 1256 | 1228 | 1262 | 1190 | 1182 | 1251 |
| Permittivity (1 GHz) | 4.20 | 4.21 | 4.17 | 4.20 | 4.19 | 4.20 | 4.17 |
| Dielectric loss tangent (1 GHz) | 0.0017 | 0.0019 | 0.0015 | 0.0017 | 0.0016 | 0.0017 | 0.0014 |
| Permittivity (5 GHz) | 4.17 | 4.18 | 4.16 | 4.17 | 4.16 | 4.17 | 4.17 |
| Dielectric loss tangent (5 GHz) | 0.0023 | 0.0024 | 0.0023 | 0.0022 | 0.0020 | 0.0021 | 0.0024 |
| Permittivity (10 GHz) | 4.08 | 4.08 | 4.05 | 4.07 | 4.06 | 4.07 | 4.03 |
| Dielectric loss tangent (10 GHz) | 0.0028 | 0.0028 | 0.0025 | 0.0027 | 0.0024 | 0.0025 | 0.0024 |

TABLE 5

| wt % | Sample No. | | | | | | | | | |
|---|---|---|---|---|---|---|---|---|---|---|
|  | 64 | 65 | 66 | 67 | 68 | 69 | 70 | 71 | 72 | 73 |
| $SiO_2$ | 49.95 | 49.90 | 49.70 | 49.36 | 49.83 | 49.18 | 51.59 | 51.83 | 51.87 | 51.98 |
| $B_2O_3$ | 33.44 | 33.75 | 34.13 | 34.94 | 34.21 | 34.50 | 33.25 | 33.40 | 33.44 | 33.51 |
| $Al_2O_3$ | 12.43 | 12.01 | 11.76 | 11.32 | 11.32 | 11.99 | 11.60 | 11.18 | 10.88 | 10.59 |
| $Li_2O$ | 0.10 | 0.24 | 0.31 | 0.34 | 0.24 | 0.24 | 0.07 | 0.20 | 0.30 | 0.39 |
| $Na_2O$ | 0.10 | 0.10 | 0.10 | 0.10 | 0.10 | 0.10 | 0.14 | 0.14 | 0.14 | 0.14 |
| $K_2O$ | 0.00 | 0.00 | 0.00 | 0.00 | 0.00 | 0.00 | 0.00 | 0.00 | 0.00 | 0.00 |
| MgO | 0.80 | 0.81 | 0.81 | 0.80 | 0.81 | 0.81 | 0.61 | 0.92 | 0.61 | 0.62 |
| CaO | 2.99 | 3.00 | 3.00 | 2.95 | 3.30 | 2.99 | 2.55 | 2.14 | 2.57 | 2.57 |
| SrO | 0.00 | 0.00 | 0.00 | 0.00 | 0.00 | 0.00 | 0.00 | 0.00 | 0.00 | 0.00 |
| $TiO_2$ | 0.00 | 0.00 | 0.00 | 0.00 | 0.00 | 0.00 | 0.00 | 0.00 | 0.00 | 0.00 |
| $Fe_2O_3$ | 0.19 | 0.19 | 0.19 | 0.19 | 0.19 | 0.19 | 0.19 | 0.19 | 0.19 | 0.20 |
| $SiO_2 + B_2O_3 + Al_2O_3$ | 95.8 | 95.7 | 95.6 | 95.6 | 95.4 | 95.7 | 96.4 | 96.4 | 96.2 | 96.1 |
| $SiO_2 + B_2O_3$ | 83.4 | 83.7 | 83.8 | 84.3 | 84.0 | 83.7 | 84.8 | 85.2 | 85.3 | 85.5 |
| $(SiO_2 + B_2O_3 + Al_2O_3)/(SiO_2 + B_2O_3)$ | 1.15 | 1.14 | 1.14 | 1.13 | 1.14 | 1.14 | 1.14 | 1.13 | 1.13 | 1.12 |
| RO | 3.8 | 3.8 | 3.8 | 3.7 | 4.1 | 3.8 | 3.2 | 3.1 | 3.2 | 3.2 |
| $R_2O$ | 0.2 | 0.3 | 0.4 | 0.4 | 0.3 | 0.3 | 0.2 | 0.4 | 0.4 | 0.5 |

TABLE 5-continued

| | | | | | | | | | |
|---|---|---|---|---|---|---|---|---|---|
| MgO/RO | 0.21 | 0.21 | 0.21 | 0.21 | 0.20 | 0.21 | 0.19 | 0.30 | 0.19 | 0.19 |
| T2 (° C.) | 1544 | 1540 | 1509 | 1515 | 1544 | 1529 | 1577 | 1574 | 1575 | 1576 |
| T2.5 (° C.) | 1415 | 1412 | 1391 | 1387 | 1414 | 1401 | 1446 | 1443 | 1447 | 1446 |
| T3 (° C.) | 1309 | 1305 | 1289 | 1281 | 1305 | 1295 | 1335 | 1331 | 1338 | 1331 |
| Devitrification temperature TL (° C.) | 1273 | 1222 | 1223 | 1174 | 1166 | 1222 | 1308 | 1266 | 1240 | 1188 |
| Permittivity (1 GHz) | 4.19 | 4.20 | 4.21 | 4.17 | 4.20 | 4.20 | 4.10 | 4.10 | 4.10 | 4.14 |
| Dielectric loss tangent (1 GHz) | 0.0019 | 0.0021 | 0.0014 | 0.0014 | 0.0020 | 0.0021 | 0.0017 | 0.0019 | 0.0013 | 0.0021 |
| Permittivity (5 GHz) | 4.16 | 4.17 | 4.18 | 4.16 | 4.17 | 4.17 | 4.07 | 4.07 | 4.10 | 4.11 |
| Dielectric loss tangent (5 GHz) | 0.0027 | 0.0028 | 0.0029 | 0.0029 | 0.0027 | 0.0029 | 0.0024 | 0.0024 | 0.0025 | 0.0026 |
| Permittivity (10 GHz) | 4.06 | 4.08 | 4.09 | 4.05 | 4.08 | 4.07 | 3.97 | 3.97 | 3.99 | 4.01 |
| Dielectric loss tangent (10 GHz) | 0.0031 | 0.0033 | 0.0023 | 0.0023 | 0.0031 | 0.0034 | 0.0029 | 0.0028 | 0.0022 | 0.0031 |

| | | Sample No. | | | | | | | |
|---|---|---|---|---|---|---|---|---|---|
| wt % | | 74 | 75 | 76 | 77 | 78 | 79 | 80 | 81 |
| | $SiO_2$ | 54.03 | 53.91 | 51.92 | 51.77 | 52.87 | 54.68 | 50.95 | 52.01 |
| | $B_2O_3$ | 32.05 | 31.98 | 33.48 | 33.36 | 32.80 | 30.28 | 29.71 | 30.34 |
| | $Al_2O_3$ | 10.17 | 10.46 | 10.90 | 11.17 | 10.61 | 11.67 | 16.03 | 11.69 |
| | $Li_2O$ | 0.28 | 0.18 | 0.30 | 0.20 | 0.30 | 0.05 | 0.04 | 0.05 |
| | $Na_2O$ | 0.19 | 0.19 | 0.14 | 0.14 | 0.14 | 0.19 | 0.19 | 0.19 |
| | $K_2O$ | 0.00 | 0.00 | 0.00 | 0.00 | 0.00 | 0.00 | 0.00 | 0.00 |
| | MgO | 0.93 | 0.93 | 0.92 | 0.61 | 0.93 | 1.23 | 1.21 | 1.23 |
| | CaO | 2.15 | 2.15 | 2.14 | 2.56 | 2.15 | 1.71 | 1.68 | 4.29 |
| | SrO | 0.00 | 0.00 | 0.00 | 0.00 | 0.00 | 0.00 | 0.00 | 0.00 |
| | $TiO_2$ | 0.00 | 0.00 | 0.00 | 0.00 | 0.00 | 0.00 | 0.00 | 0.00 |
| | $Fe_2O_3$ | 0.20 | 0.20 | 0.20 | 0.19 | 0.20 | 0.19 | 0.19 | 0.20 |
| | $SiO_2 + B_2O_3 + Al_2O_3$ | 96.3 | 96.4 | 96.3 | 96.3 | 96.3 | 96.6 | 96.7 | 94.0 |
| | $SiO_2 + B_2O_3$ | 86.1 | 85.9 | 85.4 | 85.1 | 85.7 | 85.0 | 80.7 | 82.4 |
| | $(SiO_2 + B_2O_3 + Al_2O_3)/(SiO_2 + B_2O_3)$ | 1.12 | 1.12 | 1.13 | 1.13 | 1.12 | 1.14 | 1.20 | 1.14 |
| | RO | 3.1 | 3.1 | 3.1 | 3.2 | 3.1 | 2.9 | 2.9 | 5.5 |
| | $R_2O$ | 0.5 | 0.4 | 0.4 | 0.4 | 0.4 | 0.2 | 0.2 | 0.2 |
| | MgO/RO | 0.30 | 0.30 | 0.30 | 0.19 | 0.30 | 0.42 | 0.42 | 0.22 |
| | T2 (° C.) | 1611 | 1611 | 1574 | 1566 | 1588 | 1618 | 1531 | 1580 |
| | T2.5 (° C.) | 1477 | 1477 | 1443 | 1434 | 1456 | 1485 | 1412 | 1447 |
| | T3 (° C.) | 1360 | 1362 | 1330 | 1326 | 1343 | 1371 | 1312 | 1337 |
| | Devitrification temperature TL (° C.) | 1203 | 1238 | 1247 | 1296 | 1219 | 1327 | 1506 | 1081 |
| | Permittivity (1 GHz) | 4.10 | 4.09 | 4.09 | 4.08 | 4.11 | 4.09 | 4.24 | 4.31 |
| | Dielectric loss tangent (1 GHz) | 0.0018 | 0.0017 | 0.0014 | 0.0012 | 0.0020 | 0.0014 | 0.0018 | 0.0016 |
| | Permittivity (5 GHz) | 4.06 | 4.05 | 4.08 | 4.09 | 4.08 | 4.05 | 4.21 | 4.29 |
| | Dielectric loss tangent (5 GHz) | 0.0019 | 0.0018 | 0.0024 | 0.0025 | 0.0020 | 0.0016 | 0.0024 | 0.0014 |
| | Permittivity (10 GHz) | 3.97 | 3.95 | 3.97 | 3.95 | 3.98 | 3.96 | 4.12 | 4.20 |
| | Dielectric loss tangent (10 GHz) | 0.0023 | 0.0023 | 0.0021 | 0.0020 | 0.0030 | 0.0020 | 0.0029 | 0.0018 |

TABLE 6

| | Sample No. | | | | | | | | |
|---|---|---|---|---|---|---|---|---|---|
| wt % | 82 | 83 | 84 | 85 | 86 | 87 | 88 | 89 | 90 |
| $SiO_2$ | 50.79 | 49.70 | 49.35 | 49.71 | 49.48 | 49.40 | 49.40 | 49.40 | 49.40 |
| $B_2O_3$ | 27.95 | 34.13 | 34.95 | 29.06 | 29.09 | 29.68 | 28.25 | 27.80 | 28.00 |

TABLE 6-continued

| | | | | | | | | | |
|---|---|---|---|---|---|---|---|---|---|
| Al₂O₃ | 14.47 | 11.76 | 11.32 | 14.45 | 14.46 | 13.97 | 16.35 | 16.65 | 16.80 |
| Li₂O | 0.17 | 0.31 | 0.34 | 0.17 | 0.17 | 0.32 | 0.20 | 0.20 | 0.20 |
| Na₂O | 0.13 | 0.10 | 0.10 | 0.13 | 0.13 | 0.13 | 0.13 | 0.13 | 0.13 |
| K₂O | 0.00 | 0.00 | 0.00 | 0.00 | 0.00 | 0.00 | 0.00 | 0.00 | 0.00 |
| MgO | 1.50 | 0.81 | 0.80 | 1.50 | 1.68 | 1.50 | 1.50 | 1.50 | 1.50 |
| CaO | 4.80 | 3.00 | 2.95 | 4.79 | 4.80 | 4.81 | 3.98 | 4.13 | 3.78 |
| SrO | 0.00 | 0.00 | 0.00 | 0.00 | 0.00 | 0.00 | 0.00 | 0.00 | 0.00 |
| TiO₂ | 0.00 | 0.00 | 0.00 | 0.00 | 0.00 | 0.00 | 0.00 | 0.00 | 0.00 |
| Fe₂O₃ | 0.19 | 0.19 | 0.19 | 0.19 | 0.19 | 0.19 | 0.19 | 0.19 | 0.19 |
| SiO₂ + B₂O₃ + Al₂O₃ | 93.2 | 95.6 | 95.6 | 93.2 | 93.0 | 93.0 | 94.0 | 93.9 | 94.2 |
| SiO₂ + B₂O₃ | 78.7 | 83.8 | 84.3 | 78.8 | 78.6 | 79.1 | 77.7 | 77.2 | 77.4 |
| (SiO₂ + B₂O₃ + Al₂O₃)/(SiO₂ + B₂O₃) | 1.18 | 1.14 | 1.13 | 1.18 | 1.18 | 1.18 | 1.21 | 1.22 | 1.22 |
| RO | 6.3 | 3.8 | 3.7 | 6.3 | 6.5 | 6.3 | 5.5 | 5.6 | 5.3 |
| R₂O | 0.3 | 0.4 | 0.4 | 0.3 | 0.3 | 0.5 | 0.3 | 0.3 | 0.3 |
| MgO/RO | 0.24 | 0.21 | 0.21 | 0.24 | 0.26 | 0.24 | 0.27 | 0.27 | 0.28 |
| T2 (° C.) | 1533 | 1509 | 1515 | 1496 | 1498 | 1485 | 1502 | 1505 | 1495 |
| T2.5 (° C.) | 1405 | 1391 | 1387 | 1382 | 1382 | 1368 | 1389 | 1388 | 1376 |
| T3 (° C.) | 1301 | 1289 | 1281 | 1286 | 1286 | 1269 | 1293 | 1291 | 1280 |
| Devitrification temperature TL (° C.) | | 1223 | <1169 | <1169 | <1169 | 1006 | 1290 | 1274 | 1247 |
| Permittivity (1 GHz) | 4.61 | 4.31 | 4.29 | 4.60 | 4.62 | 4.62 | 4.60 | 4.63 | 4.61 |
| Dielectric loss tangent (1 GHz) | 0.0017 | 0.0023 | 0.0024 | 0.0018 | 0.0019 | 0.0021 | 0.0017 | 0.0018 | 0.0021 |
| Permittivity (5 GHz) | 4.59 | 4.28 | 4.26 | 4.58 | 4.60 | 4.60 | 4.60 | 4.62 | 4.59 |
| Dielectric loss tangent (5 GHz) | 0.0016 | 0.0028 | 0.0029 | 0.0018 | 0.0017 | 0.0020 | 0.0024 | 0.0024 | 0.0025 |
| Permittivity (10 GHz) | 4.51 | 4.18 | 4.17 | 4.50 | 4.51 | 4.52 | 4.50 | 4.51 | 4.51 |
| Dielectric loss tangent (10 GHz) | 0.0023 | 0.0036 | 0.0037 | 0.0026 | 0.0024 | 0.0028 | 0.0032 | 0.0032 | 0.0033 |

| | Sample No. | | | | | | | | |
|---|---|---|---|---|---|---|---|---|---|
| wt % | 91 | 92 | 93 | 94 | 95 | 96 | 97 | 98 | 99 |
| SiO₂ | 49.37 | 49.40 | 50.70 | 50.70 | 51.20 | 49.29 | 49.63 | 50.25 | 50.16 |
| B₂O₃ | 28.48 | 28.00 | 31.20 | 31.20 | 31.20 | 32.43 | 32.48 | 31.87 | 31.93 |
| Al₂O₃ | 15.89 | 16.30 | 14.20 | 13.40 | 13.70 | 12.62 | 13.24 | 13.22 | 13.25 |
| Li₂O | 0.20 | 0.20 | 0.15 | 0.15 | 0.15 | 0.15 | 0.15 | 0.15 | 0.15 |
| Na₂O | 0.19 | 0.13 | 0.05 | 0.05 | 0.05 | 0.05 | 0.05 | 0.05 | 0.05 |
| K₂O | 0.00 | 0.00 | 0.00 | 0.00 | 0.00 | 0.00 | 0.00 | 0.00 | 0.00 |
| MgO | 1.50 | 1.50 | 0.50 | 0.50 | 0.50 | 0.49 | 0.49 | 0.49 | 0.49 |
| CaO | 4.18 | 4.28 | 1.30 | 1.30 | 1.00 | 1.78 | 1.70 | 1.32 | 1.70 |
| SrO | 0.00 | 0.00 | 1.70 | 1.70 | 2.00 | 3.09 | 2.16 | 2.55 | 2.17 |
| TiO₂ | 0.00 | 0.00 | 0.00 | 0.80 | 0.00 | 0.00 | 0.00 | 0.00 | 0.00 |
| Fe₂O₃ | 0.19 | 0.19 | 0.20 | 0.20 | 0.20 | 0.10 | 0.10 | 0.10 | 0.10 |
| SiO₂ + B₂O₃ + Al₂O₃ | 93.8 | 93.7 | 95.7 | 95.3 | 96.1 | 94.3 | 95.3 | 95.3 | 95.3 |
| SiO₂ + B₂O₃ | 77.9 | 77.4 | 81.5 | 81.9 | 82.4 | 81.7 | 82.1 | 82.1 | 82.1 |
| (SiO₂ + B₂O₃ + Al₂O₃)/(SiO₂ + B₂O₃) | 1.20 | 1.21 | 1.17 | 1.16 | 1.17 | 1.15 | 1.16 | 1.16 | 1.16 |
| RO | 5.7 | 5.8 | 3.5 | 3.5 | 3.5 | 5.4 | 4.4 | 4.4 | 4.4 |
| R₂O | 0.4 | 0.3 | 0.2 | 0.2 | 0.2 | 0.2 | 0.2 | 0.2 | 0.2 |
| MgO/RO | 0.26 | 0.26 | 0.14 | 0.14 | 0.14 | 0.09 | 0.11 | 0.11 | 0.13 |
| T2 (° C.) | 1500 | 1498 | 1563 | 1571 | 1583 | 1562 | 1555 | 1572 | 1578 |
| T2.5 (° C.) | 1380 | 1378 | 1423 | 1417 | 1460 | 1429 | 1424 | 1440 | 1451 |
| T3 (° C.) | 1281 | 1280 | 1328 | 1326 | 1351 | 1319 | 1317 | 1330 | 1342 |
| Devitrification temperature TL (° C.) | 1168 | 1175 | 1369 | 1352 | 1363 | 1258 | 1312 | 1332 | 1301 |
| Permittivity (1 GHz) | 4.61 | 4.64 | 4.36 | 4.26 | 4.26 | 4.32 | 4.28 | 4.30 | 4.30 |
| Dielectric loss tangent (1 GHz) | 0.0022 | 0.0020 | 0.0009 | 0.0008 | 0.0007 | 0.0009 | 0.0009 | 0.0008 | 0.0008 |
| Permittivity (5 GHz) | 4.59 | 4.62 | 4.33 | 4.23 | 4.23 | 4.29 | 4.25 | 4.27 | 4.27 |
| Dielectric loss tangent (5 GHz) | 0.0024 | 0.0023 | 0.0017 | 0.0016 | 0.0015 | 0.0012 | 0.0015 | 0.0014 | 0.0014 |

TABLE 6-continued

| Permittivity (10 GHz) | 4.51 | 4.54 | 4.25 | 4.09 | 4.18 | 4.16 | 4.15 | 4.18 | 4.17 |
|---|---|---|---|---|---|---|---|---|---|
| Dielectric loss tangent (10 GHz) | 0.0032 | 0.0031 | 0.0022 | 0.0021 | 0.0020 | 0.0022 | 0.0021 | 0.0023 | 0.0021 |

The invention claimed is:

1. A glass composition comprising, in wt %:
$49 \leq SiO_2 \leq 49.71$;
$27 \leq B_2O_3 \leq 29.68$;
$10 \leq Al_2O_3 \leq 16.80$;
$0.1 \leq R_2O \leq 0.6$;
$3 \leq RO \leq 8$;
$0.01 \leq T\text{-}Fe_2O_3 \leq 0.5$;
$0 \leq TiO_2 < 0.1$; and
$0 \leq ZnO < 0.1$, wherein
the glass composition satisfies:
$0.1 \leq MgO/(MgO+CaO) \leq 0.5$;
a permittivity at a frequency of 1 GHz is 4.65 or less; and
a temperature T3 at which a viscosity is $10^3$ dPa·s is 1300° C. or less,
where $R_2O$ is at least one oxide selected from $Li_2O$, $Na_2O$, and $K_2O$, and RO is at least one oxide selected from MgO, CaO, and SrO.

2. The glass composition according to claim 1, satisfying a temperature T2 at which a viscosity is $10^2$ dPa·s is 1650° C. or less.

3. The glass composition according to claim 1, satisfying a temperature T3 at which a viscosity is $10^3$ dPa·s is higher than a devitrification temperature TL.

4. A glass composition, comprising, in wt %:
$49 \leq SiO_2 \leq 49.71$;
$27 \leq B_2O_3 \leq 29.68$;
$10 \leq Al_2O_3 \leq 16.80$;
$0 < R_2O \leq 0.6$;
$3 < RO \leq 12$;
$0.2 \leq MgO \leq 5$;
$1 \leq CaO < 10$;
$0 \leq TiO_2 < 0.1$; and
$0 \leq ZnO < 0.1$, wherein
the glass composition satisfies:
$0.1 \leq MgO/(MgO+CaO) \leq 0.5$;
a permittivity at a frequency of 1 GHz is 4.65 or less; and
a temperature T3 at which a viscosity is $10^3$ dPa·s is 1300° C. or less,
where $R_2O$ is at least one oxide selected from $Li_2O$, $Na_2O$, and $K_2O$, and RO is at least one oxide selected from MgO, CaO, and SrO.

5. The glass composition according to claim 4, satisfying, in wt %, $MgO > R_2O$.

6. The glass composition according to claim 4, comprising, in wt %, $0.5 \leq MgO \leq 2$.

7. The glass composition according to claim 4, comprising, in wt %, $0 \leq K_2O < 0.1$.

8. A glass composition comprising, in wt %:
$40 \leq SiO_2 \leq 49.95$;
$31 \leq B_2O_3 \leq 40$;
$8 \leq Al_2O_3 \leq 18$;
$0.1 \leq R_2O \leq 1$;
$1 \leq RO \leq 10$;
$0 \leq TiO_2 < 0.1$; and
$0 \leq ZnO < 0.1$, wherein
the glass composition satisfies:
$SiO_2 + B_2O_3 \geq 77$; and
$SiO_2 + B_2O_3 + Al_2O_3 \leq 97$,
where $R_2O$ is at least one oxide selected from $Li_2O$, $Na_2O$, and $K_2O$, and RO is at least one oxide selected from MgO, CaO, and SrO.

9. A glass fiber comprising the glass composition according to claim 1.

10. A glass fiber comprising the glass composition according to claim 4.

11. A glass fiber comprising the glass composition according to claim 8.

12. A glass cloth comprising the glass fiber according to claim 9.

13. A glass cloth comprising the glass fiber according to claim 10.

14. A glass cloth comprising the glass fiber according to claim 11.

15. A prepreg comprising the glass cloth according to claim 12.

16. A prepreg comprising the glass cloth according to claim 13.

17. A printed board comprising the glass cloth according to claim 12.

18. A printed board comprising the glass cloth according to claim 13.

19. A method for producing a glass fiber, the method comprising melting the glass composition according to claim 1 at a temperature of 1400° C. or more to obtain a glass fiber having an average fiber diameter of 1 to 6 μm.

20. The glass composition according to claim 1, satisfying, in wt %, $0.1 \leq MgO/(MgO+CaO) \leq 0.26$.

21. The glass composition according to claim 4, satisfying, in wt %, $0.1 \leq MgO/(MgO+CaO) \leq 0.26$.

22. The glass composition according to claim 1, comprising, in wt %:
$49 \leq SiO_2 \leq 49.71$;
$28 \leq B_2O_3 \leq 29.68$; and
$13 \leq Al_2O_3 \leq 16.80$, wherein
the glass composition satisfies:
$0.1 \leq MgO/RO \leq 0.26$; and
$5.7 \leq RO \leq 8$.

* * * * *